(12) United States Patent
Lee et al.

(10) Patent No.: US 11,581,042 B2
(45) Date of Patent: Feb. 14, 2023

(54) PROCESSING APPARATUS AND ELECTRONIC DEVICE INCLUDING THE SAME

(71) Applicant: Samsung Electronics Co., Ltd., Suwon-si (KR)

(72) Inventors: Hyungwoo Lee, Seoul (KR); Sangjoon Kim, Hwaseong-si (KR); Seungchul Jung, Suwon-si (KR); Yongmin Ju, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/181,259

(22) Filed: Feb. 22, 2021

(65) Prior Publication Data

US 2022/0051717 A1  Feb. 17, 2022

(30) Foreign Application Priority Data

Aug. 11, 2020  (KR) .................. 10-2020-0100631

(51) Int. Cl.
*G11C 13/00* (2006.01)
*G06F 7/544* (2006.01)
*G06N 3/063* (2006.01)

(52) U.S. Cl.
CPC ........ *G11C 13/0026* (2013.01); *G06F 7/5443* (2013.01); *G06N 3/063* (2013.01); *G11C 13/004* (2013.01); *G11C 13/0038* (2013.01); *G11C 2207/063* (2013.01)

(58) Field of Classification Search
CPC ............ G11C 13/0026; G11C 13/0038; G11C 13/004; G11C 2207/063; G06F 7/5443; G06N 3/063
See application file for complete search history.

(56) References Cited

U.S. PATENT DOCUMENTS

| 5,115,492 A | 5/1992 | Engeler |
| 8,294,607 B2 | 10/2012 | Rao et al. |
| 10,243,574 B2 | 3/2019 | Kauffman et al. |

(Continued)

FOREIGN PATENT DOCUMENTS

| KR | 10-2021-0028063 A | 3/2021 |
| WO | WO 2020/068121 A1 | 4/2020 |

OTHER PUBLICATIONS

Extended European Search Report dated Nov. 3, 2021 in counterpart European Patent Application No. 21172461.2 (9 pages in English).

*Primary Examiner* — Ajay Ojha
(74) *Attorney, Agent, or Firm* — NSIP Law

(57) ABSTRACT

Provided are processing and an electronic device including the same. The processing apparatus includes a bit cell line comprising bit cells connected in series, a mirror circuit unit configured to generate a mirror current by replicating a current flowing through the bit cell line at a ratio, a charge charging unit configured to charge a voltage corresponding to the mirror current as the mirror current replicated by the mirror circuit unit is applied, and a voltage measuring unit configured to output a value corresponding to a multiply-accumulate (MAC) operation of weights and inputs applied to the bit cell line, based on the voltage charged by the charge charging unit.

39 Claims, 15 Drawing Sheets

(56) References Cited

U.S. PATENT DOCUMENTS

| | | | |
|---|---|---|---|
| 2007/0242496 A1* | 10/2007 | Hoffmann | G11C 13/0014 |
| | | | 365/148 |
| 2017/0104030 A1* | 4/2017 | Redaelli | H01L 27/2409 |
| 2018/0253643 A1 | 9/2018 | Buchanan et al. | |
| 2019/0042160 A1 | 2/2019 | Kumar et al. | |
| 2019/0042199 A1 | 2/2019 | Sumbul et al. | |
| 2020/0118619 A1 | 4/2020 | Narayanan et al. | |
| 2020/0194668 A1* | 6/2020 | Sato | H01L 45/1206 |
| 2021/0064367 A1 | 3/2021 | Kim et al. | |
| 2021/0366542 A1 | 11/2021 | Lee et al. | |
| 2021/0397931 A1* | 12/2021 | Hoang | G06F 3/0688 |
| 2022/0004852 A1 | 1/2022 | Ju et al. | |

* cited by examiner

PROCESSING APPARATUS AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2020-0100631, filed on Aug. 11, 2020, in the Korean Intellectual Property Office, the disclosure of which is incorporated by reference herein in its entirety.

BACKGROUND

1. Field

The present disclosure relates to apparatuses for performing processing and electronic device including the same.

2. Description of Related Art

A neural network apparatus may perform a multiply-accumulate (MAC) operation of repeating multiplication and addition. A neural network repeatedly performs a MAC operation in which values obtained by adding outputs of nodes of a previous layer at a specific node and weights mapped to the nodes, and performs an arithmetic operation of applying an active function to a result value of the MAC operation. In this regard, a memory access operation in which a weight and a suitable input are loaded at a desired time may be performed together. Various methods for performing arithmetic operations of a neural network, such as a MAC operation, by using another hardware architecture instead of processing a neural network using a generally known digital computer have been attempted.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a processing apparatus including a bit cell line comprising bit cells connected in series, a mirror circuit unit configured to generate a mirror current by replicating a current flowing through the bit cell line at a ratio, a charge charging unit configured to charge a voltage corresponding to the mirror current as the mirror current replicated by the mirror circuit unit is applied, and a voltage measuring unit configured to output a value corresponding to a multiply-accumulate (MAC) operation of weights and inputs applied to the bit cell line, based on the voltage charged by the charge charging unit.

The mirror circuit unit may include a first transistor connected to the bit cell line and a second transistor connected to the charge charging unit to provide the mirror current to the charge charging unit, and a gate of the first transistor and a gate of the second transistor may be connected to each other.

A channel aspect ratio of the second transistor may be less than or equal to a channel aspect ratio of the first transistor.

The mirror circuit unit may include an amplifier connected to the bit cell line to uniformly maintain a voltage at one end of the bit cell line, and an output terminal of the amplifier may be connected to the gate of the first transistor and the gate of the second transistor.

The mirror circuit unit may include an amplifier connected to the bit cell line to uniformly maintain a voltage at one end of the bit cell line.

A negative (−) input terminal of the amplifier may be connected to the bit cell line.

The ratio may be equal to or less than 1.

The ratio may be equal to or less than ½.

The charge charging unit may include a capacitor configured to charge based on a time that the mirror current may be applied, and a charging transistor configured to control a time at which the capacitor may be charged by the mirror current.

The voltage measuring unit may include a comparator configured to compare a reference voltage and a voltage across the capacitor.

The value corresponding to the MAC operation may include an active function value corresponding to a result of the MAC operation of the weights and the inputs applied to the bit cell line.

Each of the bit cells may include two variable resistors connected in parallel and two switches respectively connected to the two variable resistors in series.

In response to one of the two switches being open, the other switch may be closed.

Each of the two variable resistors may include a tunnel layer disposed between a pinned layer and a free layer, wherein a magnetization direction of the pinned layer may be fixed, and a magnetization direction of the free layer may be same as or different from a magnetization direction of the pinned layer.

The bit cell line may include a bit-data line transmitting a signal for changing a resistance value of each of the two variable resistors, and a bit-data line switch for connecting the bit-data line to each of the two variable resistors.

In another general aspect, there is provided a processing method including applying a first input and a first weight to a bit cell line comprising bit cells connected in series, transmitting, to a charge charging unit, a first mirror current obtained by replicating a current flowing through the bit cell line by a first voltage applied to the bit cell line according to a first ratio, charging a capacitor for a first time with the first mirror current, applying a second input and a second weight to the bit cell line, transmitting, to the charge charging unit, a second mirror current obtained by replicating a current flowing through the bit cell line by a second voltage applied to the bit cell line according to a second ratio, charging the capacitor for a second time with the second mirror current, and outputting a value corresponding to a multiply-accumulate (MAC) operation of weights and inputs applied to the bit cell line, using a capacitor voltage charged in the capacitor.

The first ratio and the second ratio may be equal to or less than 1.

The first ratio and the second ratio may be equal to or less than ½.

The charging of the capacitor for the second time with the second mirror current may include accumulating and charging charge in the capacitor charged with the first mirror current.

The outputting may include outputting the value by comparing a reference voltage and the charged capacitor voltage.

The value corresponding to the MAC operation may include an active function value corresponding to a result of the MAC operation of the weights and the inputs applied to the bit cell line.

In another general aspect, there is provided an electronic device including a neural network apparatus, and a processing unit configured to controlling a function of the neural network apparatus, wherein the neural network apparatus includes a bit cell line comprising bit cells connected in series, a mirror circuit unit configured to generate a mirror current by replicating a current flowing through the bit cell line at a ratio, a charge charging unit configured to charge a voltage corresponding to the mirror current as the mirror current replicated by the mirror circuit unit is applied, and a voltage measuring unit configured to output a value corresponding to a multiply-accumulate (MAC) operation of weights and inputs applied to the bit cell line, based on the voltage charged by the charge charging unit.

The mirror circuit unit may include a first transistor connected to the bit cell line and a second transistor connected to the charge charging unit to provide the mirror current to the charge charging unit, and a gate of the first transistor and a gate of the second transistor may be connected to each other.

A channel aspect ratio of the second transistor may be less than or equal to a channel aspect ratio of the first transistor.

The mirror circuit unit may include an amplifier connected to the bit cell line to uniformly maintain a voltage at one end of the bit cell line, and an output terminal of the amplifier may be connected to the gate of the first transistor and the gate of the second transistor.

The mirror circuit unit may include an amplifier connected to the bit cell line to uniformly maintain a voltage at one end of the bit cell line.

A negative (−) input terminal of the amplifier may be connected to the bit cell line.

The ratio may be equal to or less than 1.

The charge charging unit may include a capacitor configured to charge based on a time that the mirror current is applied, and a charging transistor configured to control a time at which the capacitor may be charged by the mirror current.

The voltage measuring unit may include a comparator configured to compare a reference voltage and a voltage across the capacitor.

The value corresponding to the MAC operation may include an active function value corresponding to a result of the MAC operation of the weights and the inputs applied to the bit cell line.

Each of the bit cells may include two variable resistors connected in parallel and two switches respectively connected to the two variable resistors in series.

The bit cell line may include a bit-data line transmitting a signal for changing a resistance value of each of the two variable resistors, and a bit-data line switch for connecting the bit-data line to each of the two variable resistors.

Other features and aspects will be apparent from the following detailed description, the drawings, and the claims

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
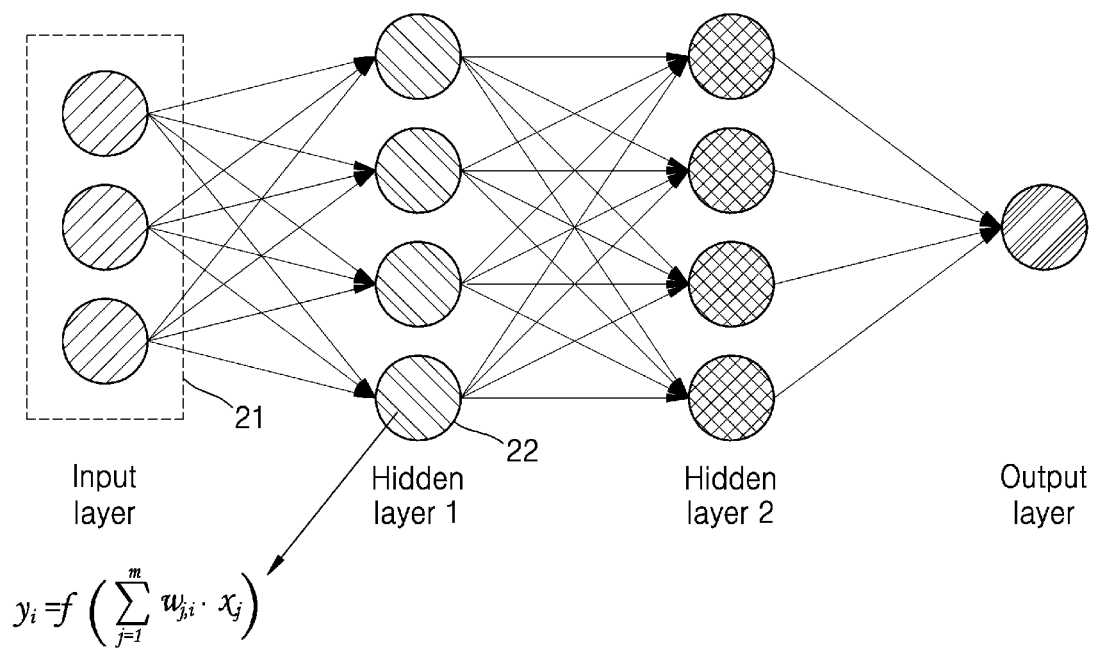
FIG. 1 is a diagram illustrating an example of a neural network.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular examples only and is not to be limiting of the examples. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

As used herein, the term "and/or" includes any one and any combination of any two or more of the associated listed items. An expression used in the singular may encompass the expression in the plural, unless it has a clearly different meaning in the context.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples. An expression such as "A or B" or "A and/or B" may include all possible combinations of items listed together.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. In addition, when a part "includes" an element, the part may further include another element instead of excluding the other element, unless otherwise stated.

Embodiments described below are related to technical fields of processing apparatuses (for example, neuromorphic processors, neural processors, and the like), and detailed descriptions about the elements or features that are widely known in the technical fields will be omitted.

A processing apparatus may include an analog circuit for processing multiplication and addition operations, unlike a general digital computer that exchanges information by using a common data bus. In other words, the processing apparatus may perform in-memory processing or internal processing. Accordingly, the processing apparatus may be referred to as various terms such as an in-memory processing device, a processor-in-memory (PIM), and a function-in-memory (FIM).

FIG. 1 is a diagram illustrating an example of a neural network 20.

Referring to FIG. 1, the neural network 20 is an example of an artificial neural network that is a series of algorithms that has an ability to solve a problem, to recognize underlying relationships in a set of data through a learning or training process. The artificial neural network (ANN) includes artificial neurons (nodes) that form a network through synaptic combinations and changes a connection strength of the synapses through training. The artificial neural network may indicate an overall model having a problem-solving ability as artificial neurons or nodes constituting a network through synaptic connections change an intensity of the synaptic connections through learning. In the artificial neural network, each neuron may multiply an input value by a weight and add a bias, and then apply an activation function to obtain an output value. The activation function may determine a form of a value that passes through such artificial neural network.

The neural network may include a plurality of layers. The plurality of layers may include an input layer, at least one hidden layer, and an output layer. In an example, neural network may include a sub-sampling layer, a pooling layer, a fully connected layer, etc., in addition to a convolution layer. The neural network may map input data and output data that have a nonlinear relationship based on deep learning to perform tasks such as, for example, speech recognition and image recognition.

The neural network may be trained to perform a desired operation by mapping input data and output data that have a nonlinear relationship therebetween through deep learning to perform various tasks. The deep learning is a machine learning method used to solve a problem given from a big dataset. The deep learning may also be construed as a problem-solving process for optimization to find a point where energy is minimized while training the neural network using provided training data. Through deep learning, for example, supervised or unsupervised learning, a weight corresponding to an architecture or a model of the neural network may be obtained, and the input data and the output data may be mapped to each other based on the obtained weight. In an example, a parameter of each of the nodes of the neural network may be adjusted while an error of a result output by the output layer is propagated backward along the neural network.

The neural network may include a deep neural network (DNN). For example, the neural network may include a convolutional neural network (CNN), a recurrent neural network (RNN), a perceptron, a feedforward (FF) network, a radial basis function (RBF) network, a deep FF (DFF) network, a long short-term memory (LSTM), a gated recurrent unit (GRU), an autoencoder (AE), a variational AE (VAE), a denoising AE (DAE), a sparse AE (SAE), a Markov chain (MC), a Hopfield network (HN), a Boltzmann machine (BM), a restricted BM (RBM), a deep belief network (DBN), a deep convolutional network (DCN), a deconvolutional network (DN), a deep convolutional inverse graphics network (DCIGN), a generative adversarial network (GAN), a liquid state machine (LSM), an extreme learning machine (ELM), an echo state network (ESN), a deep residual network (DRN), a differentiable neural computer (DNC), a neural turning machine (NTM), a capsule network (CN), a Kohonen network (KN), and an attention network (AN).

For convenience of description, the neural network 20 is illustrated as including two hidden layers (e.g., hidden layer 1 and hidden layer 2), but may include any number of hidden layers. Also, in FIG. 1, the neural network 20 is illustrated as including a separate input layer 21 for receiving input data but the input data may be directly input to a hidden layer.

Artificial nodes of layers excluding an output layer in the neural network 20 may be connected to artificial nodes of a next layer via links for transmitting an output signal. Through such links, values obtained by multiplying a weight assigned to each link and a node value of each artificial node included in a previous layer may be input to one artificial node. The node values of the previous layer correspond to axon values and the weights correspond to synaptic weights. The weight may be referred to as a parameter of the neural network 20. An active function may include a sigmoid, a hyperbolic tangent (Tan h), and a rectified linear unit (ReLU), and nonlinearity may be formed in the neural network 20 by the active function.

An output of an arbitrary node 22 included in the neural network 20 may be represented as Equation 1 below.

$$y_i = f\left(\sum_{j=1}^{m} w_{j,i} x_j\right) \quad \text{[Equation 1]}$$

Equation 1 may indicate an output value $y_i$ of the $i^{th}$ node 22 regarding m input values in an arbitrary layer. $x_j$ may denote an output value of a $j^{th}$ node of a previous layer and $w_{j,i}$ may denote a weight applied to an interconnection of the $i^{th}$ node 22 of a current layer and the $j^{th}$ node of the previous layer. f( ) may denote an active function. As shown in Equation 1, a multiplication accumulation result of an input value $x_j$ and a weight $w_{j,i}$ may be used with respect to the active function. In other words, a multiply-accumulate (MAC) operation of the suitable input value $x_j$ and the weight $w_{j,i}$ at a desired time may be repeated. In addition, there are various application fields that require the MAC operation and, in this regard, a processing apparatus capable of processing the MAC operation in an analog circuit region may be used.

Figure 2:
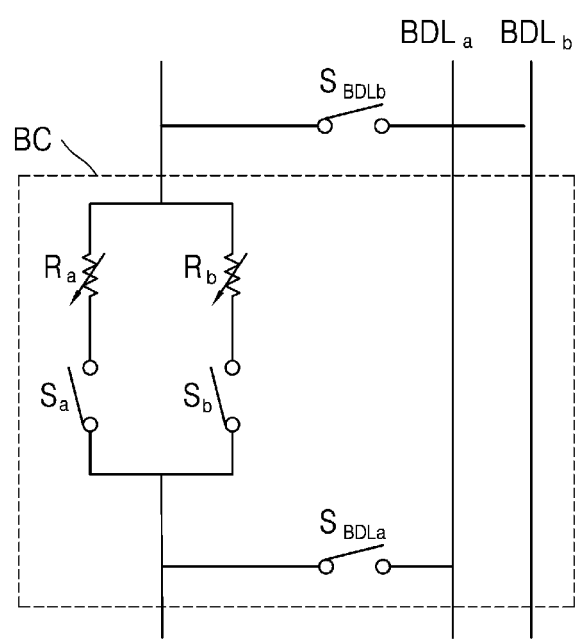
FIG. 2 is a circuit diagram illustrating an example of a bit cell used in a processing apparatus.

FIG. 2 is a circuit diagram illustrating an example of a bit cell BC used in a processing apparatus, and a structure and operations of the bit cell BC will be described with reference to FIG. 2.

The bit cell BC of FIG. 2 may be a circuit configuration included in the processing apparatus for implementing a neuromorphic processor, a neural processor, or the like. The processing apparatus may be, for example, an in-memory processing unit that stores data in a memory (a resistance memory device or the like) and uses the stored data when an arithmetic operation is needed.

The bit cell BC may include a pair of first and second variable resistors $R_a$ and $R_b$, which are connected in parallel, a pair of first and second switches $S_a$ and $S_b$, which are respectively connected to the first and second variable resistors $R_a$ and $R_b$ in series, and lower and upper bit-data line switches $S_{BDLa}$ and $S_{BDLb}$ respectively connected to first and second bit-data lines $BLD_a$ and $BLD_b$. The circuit configuration of the bit cell BC of FIG. 2 is only an example and the bit cell BC may be implemented as an equivalent circuit using other circuit devices.

The pair of first and second variable resistors $R_a$ and $R_b$ are variable devices where different resistance values are settable and the resistance values of the first and second variable resistors $R_a$ and $R_b$ may be determined by a weight applied to the bit cell BC. For example, each of the first and second variable resistors $R_a$ and $R_b$ may have any one resistance value from among two resistance values, for example, may have a resistance value of 15 MΩ or 10 MΩ. When a weight applicable to the bit cell BC is 1, the first variable resistor $R_a$ may be 15 MΩ and the second variable resistor $R_b$ may be 10 MΩ. In another example, when the weight of −1 is applied, the first variable resistor $R_a$ may be 10 MΩ and the second variable resistor $R_b$ may be 15 MΩ. As in the above example, the pair of first and second variable resistors $R_a$ and $R_b$ may be complementarily set to have different resistance values.

In an example, the first and second variable resistors $R_a$ and $R_b$ may be resistance memory devices. The resistance memory device is a device that may be switched between different resistance states according to a voltage or current applied across the resistance memory device and may have a plurality of resistance states. The resistance memory device may have a single-layer structure or a multi-layer structure including, for example, a transition metal oxide, a metal oxide such as a perovskite-based material, a phase-change material such as a chalcogenide-based material, a ferroelectric material, or a ferromagnetic material. An operation in which the resistance memory device changes from a high-resistance state to a low-resistance state may be referred to a set operation and an operation in which the resistance memory device changes from the low-resistance state to the high-resistance state may be referred to as a reset operation.

A method of changing the resistance values of the first and second variable resistors $R_a$ and $R_b$ will be further described. First, both ends of a variable resistor to be changed are respectively connected to the first bit-data line BDLa and the second bit-data line BDLb. With reference to the first variable resistor $R_a$, one end of the first variable resistor $R_a$ (an upper end portion of the first variable resistor $R_a$ in FIG. 2) may be connected to the second bit-data line BDLb via the upper bit-data line switch $S_{BDLb}$ and the other end of the first variable resistor $R_a$ (a lower end portion of the first variable resistor $R_a$ in FIG. 2) may be connected to the first bit-data line BDLa via the first switch $S_a$ and the lower bit-data line $S_{BDLa}$.

The upper bit-data line switch $S_{BDLb}$ may be a switch not included in the bit cell BC of FIG. 2. For example, the upper bit-data line switch $S_{BDLb}$ may be a switch included in a bit cell (not shown) adjacent to the bit cell BC of FIG. 2 or may be an independent switch not included in another bit cell.

When the first variable resistor $R_a$ is connected to the first and second bit-data lines BDLa and BDLb, a set operation or a reset operation may be performed on the first variable resistor $R_a$ by controlling a voltage across the first variable resistor $R_a$ or a current flowing through the first variable resistor $R_a$ via the first and second bit-data lines BDLa and BDLb. In another example, a set operation or a reset operation may be performed on the second variable resistor $R_b$ as the second variable resistor $R_b$ is connected to the first and second bit-data lines BDLa and BDLb when the lower and upper bit-data line switches $S_{BDLa}$ and $S_{BDLb}$ at the two ends of the bit cell BC and the second switch $S_b$ are closed.

A voltage and/or current applied to change the resistance values of the first and second variable resistors $R_a$ and $R_b$ may be relatively very high values compared to a voltage and/or current applied to read the resistance values of the first and second variable resistors $R_a$ and $R_b$. The resistance values of the first and second variable resistors $R_a$ and $R_b$ may not be changed by the voltage and/or current applied to read the resistance values of the first and second variable resistors $R_a$ and $R_b$.

An example in which the first and second variable resistors $R_a$ and $R_b$ are implemented as magnetic tunnel junction (MTJ) devices will be described below with reference to FIGS. 3A and 3B.

The pair of first and second switches $S_a$ and $S_b$ connected to the first and second variable resistors $R_a$ and $R_b$ in series may perform on/off operations depending on an input applied to the bit cell BC. The first and second switches $S_a$ and $S_b$ may operate complementarily such that when one is closed, the other one is opened. For example, the first switch $S_a$ may be closed and the second switch $S_b$ may be opened when the input of 1 is applied to the bit cell BC and the first switch $S_a$ may be opened and the second switch $S_b$ may be closed when the input of −1 is applied to the bit cell BC.

According to operation methods of a variable resistor and switch described above, a resistance value measured across the bit cell BC may vary depending on a weight and input applied to the bit cell BC of FIG. 2. Relationships between the weight, the input, and the resistance value across the bit cell BC may be as Table 1 below.

TABLE 1

| Input | Weight | Input × Weight | Resistance Value MΩ |
|---|---|---|---|
| 1 | 1 | 1 | 15 |
| 1 | −1 | −1 | 10 |
| −1 | 1 | −1 | 10 |
| −1 | −1 | 1 | 15 |

Referring to Table 1, the resistance value of the bit cell BC is 15 MΩ when a value obtained by multiplying the input and the weight is 1 and the resistance value of the bit cell BC is 10 MΩ when the value obtained by multiplying the input and the weight is −1. In other words, the product of the input and weight applied to the bit cell BC is determined when the resistance value of the bit cell BC is measured or a voltage drop of the bit cell BC according to a current of a uniform value is measured. A processing apparatus (for example, a neuromorphic processor or the like) calculating a sum of products of inputs and weights by using such characteristics of the bit cell BC may be implemented.

Figure 3A:
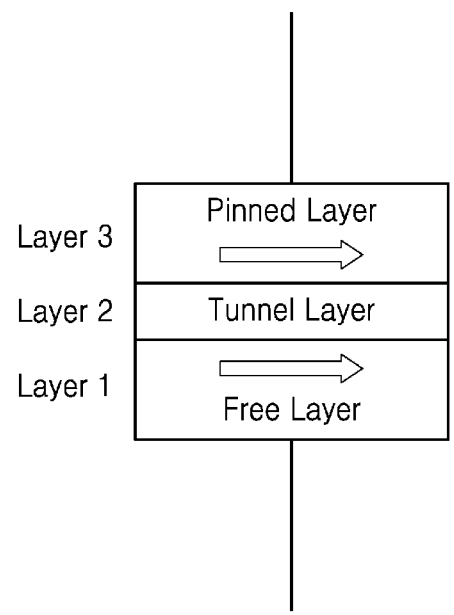
FIGS. 3A and 3B are diagrams illustrating examples for describing structures and operations of a variable resistor applied to the bit cell of FIG. 2.
Figure 3B:
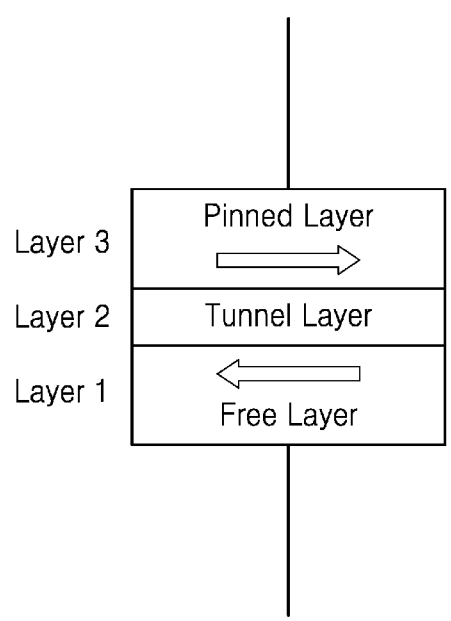

FIGS. 3A and 3B are diagrams illustrating examples for describing structures and operations of a variable resistor applicable to the bit cell BC of FIG. 2. The first and second variable resistors $R_a$ and $R_b$ may be implemented as MTJ devices and may have non-volatile characteristics in which a resistance value changes according to the size and direction of a current (or a voltage) and is maintained even when an input current (or voltage) is blocked.

Referring to FIGS. 3A and 3B, the MTJ device may include a pinned layer Layer 3, a free layer Layer 1, and a tunnel layer Layer 2 therebetween. A magnetization direction of the pinned layer Layer 3 is fixed and a magnetization direction of the free layer Layer 1 may be the same as or different from the magnetization direction of the pinned layer Layer 3 according to conditions.

In FIG. 3A, magnetization directions of the free layer Layer 1 and pinned layer Layer 3 are parallel in the MTJ device. As such, when the magnetization directions are parallel, the MTJ device may have a low resistance value, for example, resistance of 10 MΩ. In FIG. 3B, the magnetization directions of the free layer Layer 1 and pinned layer Layer 3 are anti-parallel in the MTJ device. As such, when the magnetization directions are anti-parallel, the MTJ device may have a high resistance value, for example, resistance of 15 MΩ. Accordingly, a resistance value of a variable resistor may change by changing the magnetization direction of the free layer Layer 1.

The magnetization direction of the free layer Layer 1 may change by an electric/magnetic factor provided outside and/or inside a resistance memory cell. The free layer Layer 1 may include a material having a changeable magnetization direction, for example, a ferromagnetic material, such as, for example, CoFeB, FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and/or a combination thereof.

The tunnel layer Layer 2 may have a thickness smaller than a spin diffusion distance and may include a non-magnetic material, such as, for example, magnesium (Mg), titanium (Ti), aluminum (Al), an oxide of magnesium-zinc (MgZn) or magnesium-boron (MgB), titanium (Ti), vanadium (V), and/or a combination thereof.

The pinned layer Layer 3 may have a magnetization direction fixed by an antiferromagnetic layer. The pinned layer Layer 3 may include a ferromagnetic material, such as, for example, CoFeB, FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, $Y_3Fe_5O_{12}$, and/or a combination thereof, and may further include an antiferromagnetic layer and/or a synthetic antiferromagnetic layer to fix the magnetization direction. The antiferromagnetic layer may include an antiferromagnetic material, such as PtMn, IrMn, MnO, MnS, MnTe, $MnF_2$, $FeC_{12}$, FeO, $CoC_{12}$, CoO, $NiC_{12}$, NiO, Cr, and/or a combination thereof. The synthetic antiferromagnetic layer may include Cu, Ru, Ir and/or a combination thereof.

Figure 4:
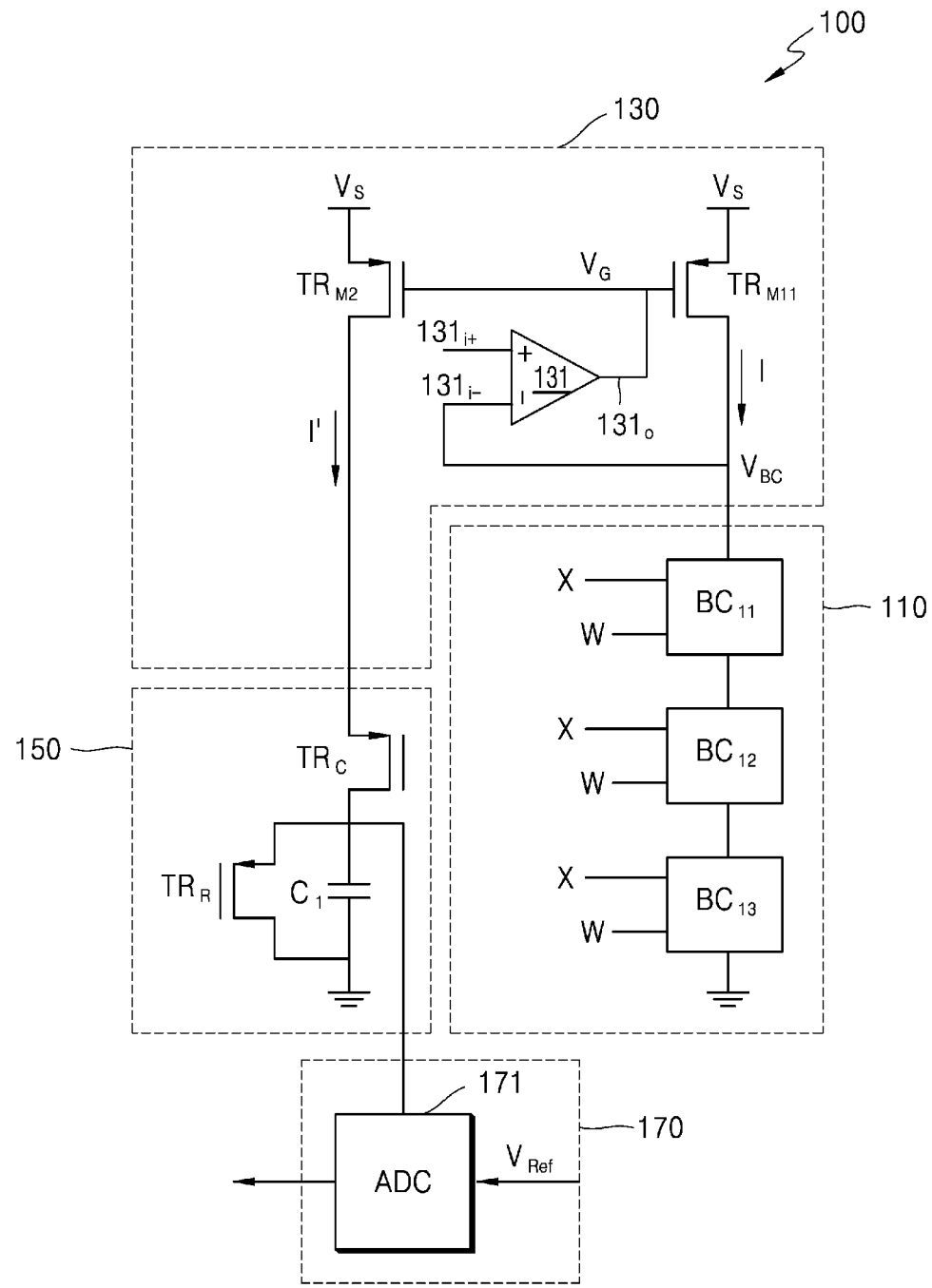
FIG. 4 is a diagram illustrating an example of a processing apparatus.

FIG. 4 is a diagram illustrating an example of a processing apparatus 100.

Referring to FIG. 4, the processing apparatus 100 may include a bit cell line 110 including three bit cells, i.e., first through third bit cells $BC_{11}$ through $BC_{13}$ connected in series, a mirror circuit unit 130 replicating a current flowing through the bit cell line 110, a charge charging unit 150 including a capacitor $C_1$ charging charge with a mirror current transmitted from the mirror circuit unit 130, and a voltage measuring unit 170 measuring a potential difference at both ends of the capacitor $C_1$. In FIG. 4, x and w may represent input and weight, respectively.

The bit cell line 110 may include the plurality of bit cells (e.g., first through third bit cells $BC_{11}$ through $BC_{13}$) connected in series and each bit cell may have a same structure as the bit cell BC of FIG. 2. The bit cell line 110 of FIG. 4 includes three bit cells, i.e., the first through third bit cells $BC_{11}$ through $BC_{13}$, but the number of bit cells included in one bit cell line 110 may be more than three, for example, from 64 to 256. Because the first through third bit cells $BC_{11}$ through $BC_{13}$ are connected in series, amounts of currents flowing through the first through third bit cells $BC_{11}$ through $BC_{13}$ are the same. For example, when a current of 1 A flows in the first bit cell $BC_{11}$, the current of 1 A also flows in the second and third bit cells $BC_{12}$ and $BC_{13}$. The size of current flowing in the bit cell line 110 may be determined by the Ohm's Law from a bit cell line voltage $V_{BC}$ at an upper end of the bit cell line 110 and a combined resistance value of the first through third bit cells $BC_{11}$ through $BC_{13}$. As described above with reference to the bit cell BC of FIG. 2, the combined resistance value of the bit cell line 110 may be determined by a resistance value shown from each bit cell by a weight and input applied to each bit cell. When resistance values of the first and second bit cells $BC_{11}$ and $BC_{12}$ are 15 MΩ and a resistance value of the third bit cell $BC_{13}$ is 10 MΩ, the combined resistance value of the bit cell line 110 is 40(15+15+10) MΩ, and when the bit cell line voltage $V_{BC}$ is 80 V, a current of 2 μA may flow in the bit cell line 110.

The mirror circuit unit 130 may include first and second transistors $TR_{M1}$ and $TR_{M2}$, and an amplifier 131, and may replicate the current flowing in the bit cell line 110 and transmit the replicated current to the charge charging unit 150. The current replicated by the mirror circuit unit 130 is a bit cell line current I flowing in the bit cell line 110 through the first transistor $TR_{M1}$, and the replicated current may be a mirror current I' flowing in the charge charging unit 150 through the second transistor $TR_{M2}$.

In other words, the mirror circuit unit 130 may generate a mirror current by replicating a current flowing in a bit cell line at a certain ratio, and an operation by which the mirror circuit unit 130 replicates a current will be described below.

The first transistor $TR_{M1}$ of the mirror circuit unit 130 may be a p-type metal oxide semiconductor field effect transistor (MOSFET), and the bit cell line current I flowing in the first transistor $TR_{M1}$ may satisfy Equation 2 below.

$$I = \frac{1}{2}k_{p1}\frac{W_1}{L_1}(V_{GS} - V_{th1})^2 \qquad \text{[Equation 2]}$$

Figure 5:
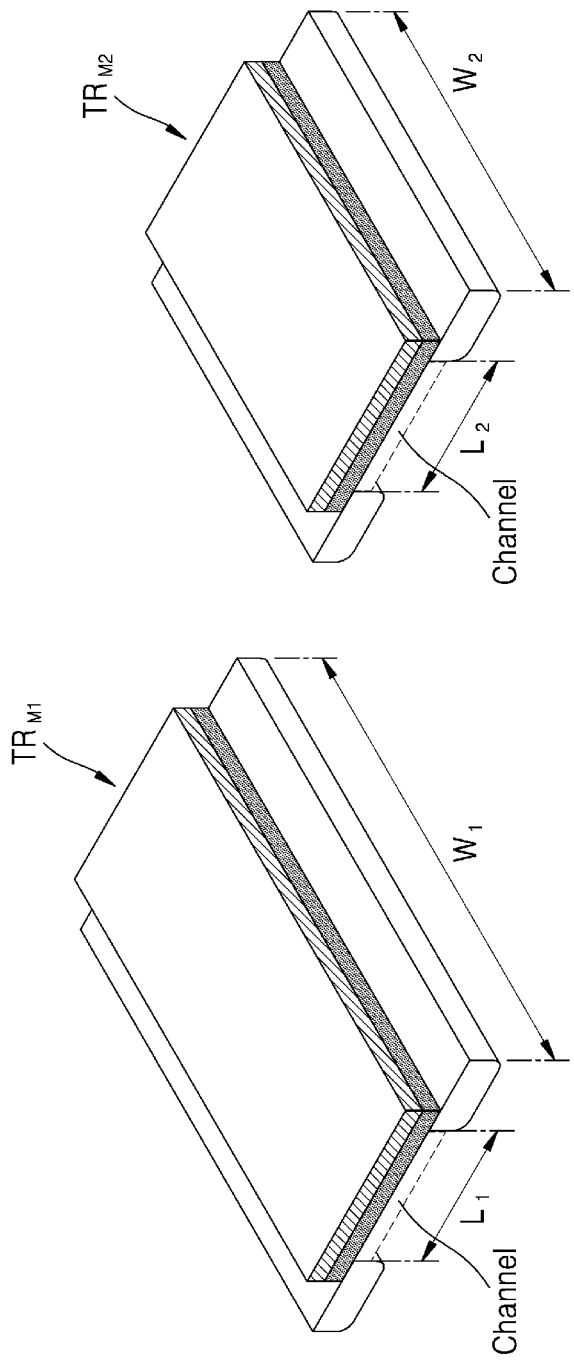
FIG. 5 is a diagram illustrating an example of transistors of a mirror circuit unit of FIG. 4.

In Equation 2, $k_{p1}$ is a constant for a device characteristic of the first transistor $TR_{M1}$ determined by a dielectric constant and thickness of a gate oxide layer and capacitance per unit area of a capacitor generated by the gate oxide film. $W_1/L_1$ denotes a channel aspect ratio, i.e., a ratio of a channel width $W_1$ and a channel length $L_1$ of the first transistor $TR_{M1}$ (see FIG. 5). $V_{GS}$ denotes a difference between a gate voltage $V_G$ and a source voltage $V_S$, and $V_{th1}$ denotes a threshold voltage of the first transistor $TR_{M1}$. Other elements included in Equation 2 excluding $V_{GS}$, for example, $k_{p1}$, $V_{th1}$, and the like may be values that do not change after manufacturing of a transistor is completed. In other words, an amount of current flowing in the first transistor $TR_{M1}$ after it has been manufactured may be determined by $V_{GS}$.

The second transistor $TR_{M2}$ may also be a p-type MOSFET and the mirror current I' flowing in the second transistor $TR_{M2}$ may satisfy Equation 3 below.

$$I' = \frac{1}{2}k_{p2}\frac{W_2}{L_2}(V_{GS} - V_{th2})^2 \qquad \text{[Equation 3]}$$

As described with reference to Equation 2, $k_{p2}$ and $V_{th2}$ are constants regarding device characteristics of the second transistor $TR_{M2}$, and $V_{th2}$ denotes a threshold voltage of the second transistor $TR_{M2}$. $W_2/L_2$ denotes a channel aspect ratio of the second transistor $TR_{M2}$ (see FIG. 5).

Referring to Equations 2 and 3, comparing the sizes of the bit cell line current I and the mirror current I' flowing in the first and second transistors $TR_{M1}$ and $TR_{M2}$, because the first and second transistors $TR_{M1}$ and $TR_{M2}$ are generally manufactured using same materials and similar processes, values of $k_{p1}$ and $V_{th1}$ may be the same as values of $k_{p2}$ and $V_{th2}$. Also, referring to FIG. 4, because the source voltage $V_S$ and the gate voltage $V_G$ of the first and second transistors $TR_{M1}$ and $TR_{M2}$ are the same, a factor determining the sizes of the bit cell line current I and the mirror current I' may be a channel aspect ratio (W/L) of each transistor. For example, when the channel aspect ratio $W_1/L_1$ of the first transistor $TR_{M1}$ is greater than the channel aspect ratio $W_2/L_2$ of the second transistor $TR_{M2}$, the bit cell line current I is greater than the mirror current I', and when the channel aspect ratio $W_1/L_1$ of the first transistor $TR_{M1}$ is the same as the channel aspect ratio $W_2/L_2$ of the second transistor $TR_{M2}$, the bit cell line current I may be the same as the mirror current I'. In other words, the mirror current I' of a desired ratio may be obtained by adjusting a ratio of the channel aspect ratio $W_2/L_2$ of the second transistor $TR_{M2}$ and the channel aspect ratio $W_1/L_1$ of the first transistor $TR_{M1}$. For example, when the channel aspect ratio $W_2/L_2$ of the second transistor $TR_{M2}$ is adjusted to be ½ of the channel aspect ratio $W_1/L_1$ of the first transistor $TR_{M1}$, the size of the mirror current I' may be reduced to ½ of the bit cell line current I. In an example, a ratio of the channel aspect ratio of the first transistors and the channel aspect ratio of second transistors may be equal to or less than 1, or equal to or less than ½. Hereinafter, it is assumed that the channel aspect ratios $W_1/L_1$ and $W_2/L_2$ of the first and second transistors $TR_{M1}$ and $TR_{M2}$ are the same unless specified otherwise.

The amplifier 131 may include two input terminals, i.e., positive input terminal and negative input terminal $131_{i+}$ and $131_{i-}$, and one output terminal $131_o$, and may maintain the bit cell line voltage $V_{BC}$ to a uniform value. The amplifier 131 may be an operational amplifier that amplifies a difference between a voltage $V_{in+}$ of the positive input terminal $131_{i+}$ and a voltage $V_{in-}$ of the negative input terminal $131_{i-}$ by a gain G, and outputs, the amplified difference, as a voltage $V_{out}$ of the output terminal $131_o$. The voltages $V_{in+}$ and $V_{in-}$ of the positive and negative input terminals $131_{i+}$ and $131_{i-}$ and the voltage $V_{out}$ of the output terminal $131_o$ may satisfy Equation 4 below.

$$G*(V_{in+} - V_{in-}) = V_{out} \qquad \text{[Equation 4]}$$

In Equation 4, G denotes a gain of an amplifier and an ideal operational amplifier may have an infinite gain G. When the amplifier 131 of FIG. 4 is assumed to be an ideal operational amplifier having an infinite gain G and the left-hand side and the right-hand side of Equation 4 are divided by the gain G, the right-hand side converges to 0 and the voltage $V_{in+}$ of the positive input terminal $131_{i+}$ of the amplifier 131 and the voltage $V_{in-}$ of the negative input terminal 131 have the same value. As such, the bit cell line voltage $V_{BC}$ may maintain a uniform value by using characteristics of the amplifier 131 in which voltages of the positive and negative input terminals $131_{i+}$ and $131_{i-}$ are the same. For example, as shown in FIG. 4, when the negative input terminal 131 of the amplifier 131 is connected to an upper portion of the bit cell line 110 and the positive input terminal $131_{i+}$ is maintained at 5 V, the voltage $V_{in-}$ of the negative input terminal $131_{i-}$ is 5 V because it is the same as the voltage $V_{in+}$ of the positive input terminal $131_{i+}$ and the bit cell line voltage $V_{BC}$ may maintain 5 V because it is the same as the voltage $V_{in-}$ of the negative input terminal $131_{i-}$.

Because the operational amplifier has characteristics that there is no current flow to input terminals, the current flowing in the first transistor $TR_{M1}$ may not leak to the negative input terminal $131_{i-}$ but may flow through the bit cell line 110. Accordingly, the current flowing in the first transistor $TR_{M1}$ may be maintained to be the same as the bit cell line current I.

When the operations of the bit cell line 110 and the mirror circuit unit 130 are associated, the current flowing in the bit cell line 110 may be determined by the bit cell line voltage $V_{BC}$ and combined resistance of the bit cell line 110, and is the same as the current flowing in the first transistor $TR_{M1}$. Because the channel aspect ratios (W/L) of the first transistor $TR_{M1}$ and the second transistor $TR_{M2}$ are the same, the current flowing in the first transistor $TR_{M1}$ is the same as the current flowing in the second transistor $TR_{M2}$. Accordingly, the mirror current I' having the same size as the bit cell line current I flowing in the bit cell line 110 may be transmitted to the charge charging unit 150.

The charge charging unit 150 may include the capacitor $C_1$, a charging transistor $TR_C$, and a reset transistor $TR_R$, and may charge the mirror current I' transmitted from the mirror circuit unit 130 for a desired time. In other words, the charge charging unit 150 may charge a voltage corresponding to the mirror current I' as the mirror current I' replicated by the mirror circuit unit 130 is applied. The charging transistor and the reset transistor $TR_C$ and $TR_R$ of the charge charging unit 150 may be turned on or off according to a control signal of a controller (not shown).

A time during which the mirror current I' charges the capacitor $C_1$ may be controlled by an on/off operation of the charging transistor $TR_C$. For example, when the mirror current I' is 5 μk and the charging transistor $TR_C$ maintains an on-state for 2 ns, charges of 10 fc may be charged in the capacitor $C_1$. Because charges charged in the capacitor $C_1$ are not leaked while the charging transistor $TR_C$ is in an off-state, a potential difference at both ends of the capacitor $C_1$, i.e., a capacitor voltage may be uniformly maintained.

The charges charged in the capacitor $C_1$ may be removed by the on/off operation of the reset transistor $TR_R$. In an example, when the reset transistor $TR_R$ is turned on, the voltage across the capacitor $C_1$ becomes a ground voltage (0 V) and the charged charges may be removed.

The voltage measuring unit 170 outputs a value corresponding to an MAC operation result of weights and inputs applied to the bit cell line 110, based on the charges charged in the charge charging unit 150 (i.e., the capacitor voltage of the capacitor $C_1$).

In an example, the voltage measuring unit 170 may compare the voltage of the capacitor $C_1$ of the charge charging unit 150 and a reference voltage $V_{Ref}$ and output a result of the comparison. The reference voltage $V_{Ref}$ is a voltage pre-determined as a value provided to relatively measure the size of the voltage of the capacitor $C_1$, and one or more reference voltages $V_{Ref}$ may be provided. The voltage measuring unit 170 may include a reference voltage generating unit (not shown) for generating the reference voltage $V_{Ref}$ or a receiving unit (not shown) for receiving the reference voltage $V_{Ref}$ from an external source. The voltage measuring unit 170 may include an analog-digital converter (ADC) 171 for outputting the result of comparing the voltage of the capacitor $C_1$ and the reference voltage $V_{Ref}$ in a digital value. An output of the voltage measuring unit 170 may be a value indicating a sum of products of inputs and weights applied to the bit cell line 110 and specific operations of the voltage measuring unit 170 will be described below with reference to FIG. 7.

Figure 6:
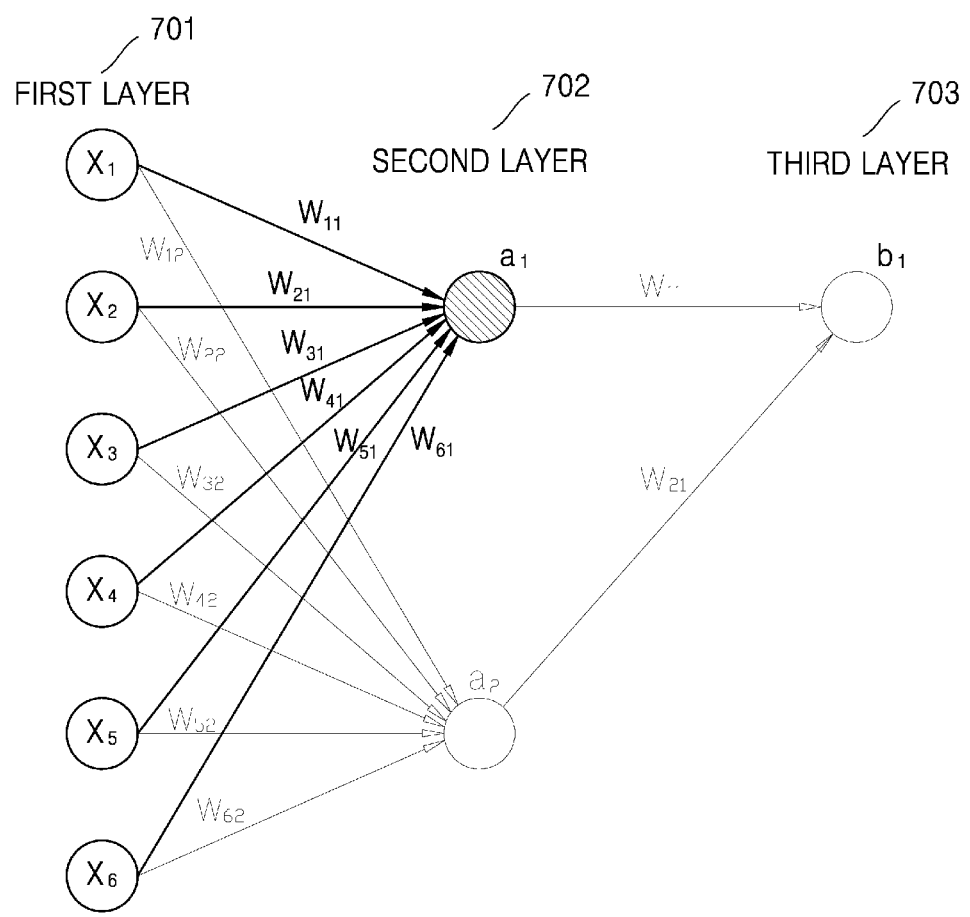
FIG. 6 is a diagram illustrating an example of a neural network.

FIG. 6 is a diagram illustrating an example of a neural network.

FIG. 6 is a diagram illustrating an example of a neural network including six nodes in a first layer 701 and two nodes in a second layer 702.

Referring to FIG. 6, an MAC operation of six multiplication operations of multiplying inputs $x_1$, $x_2$, $x_3$, $x_4$, $x_5$, and $x_6$ from nodes of the first layer 701 respectively by weights $w_{11}$, $w_{21}$, $w_{31}$, $w_{41}$, $w_{51}$, and $w_{61}$ and adding multiplication result values may be performed in a first node $a_1$ of the second layer 702 as in Equation 5 below, and an MAC operation of six multiplication operations of multiplying the inputs $x_1$, $x_2$, $x_3$, $x_4$, $x_5$, and $x_6$ from the nodes of the first layer 701 respectively by weights $w_{12}$, $w_{22}$, $w_{32}$, $w_{42}$, $w_{52}$, and $w_{62}$ and adding multiplication result values may be performed in a second node $a_2$ as in Equation 6 below.

$$a_1 = x_1 \cdot w_{11} + x_2 \cdot w_{21} + x_3 \cdot w_{31} + x_4 \cdot w_{41} + x_5 \cdot w_{51} + x_6 \cdot w_{61} \quad \text{[Equation 5]}$$

$$a_2 = x_1 \cdot w_{12} + x_2 \cdot w_{22} + x_3 \cdot w_{32} + x_4 \cdot w_{42} + x_5 \cdot w_{52} + x_6 \cdot w_{62} \quad \text{[Equation 6]}$$

A result obtained by applying arithmetic operation results of Equations 5 and 6 to an active function, such as a sigmoid function, as in Equation 1 above may be provided, as an input, to a node bi of a third layer 703.

Figure 7:
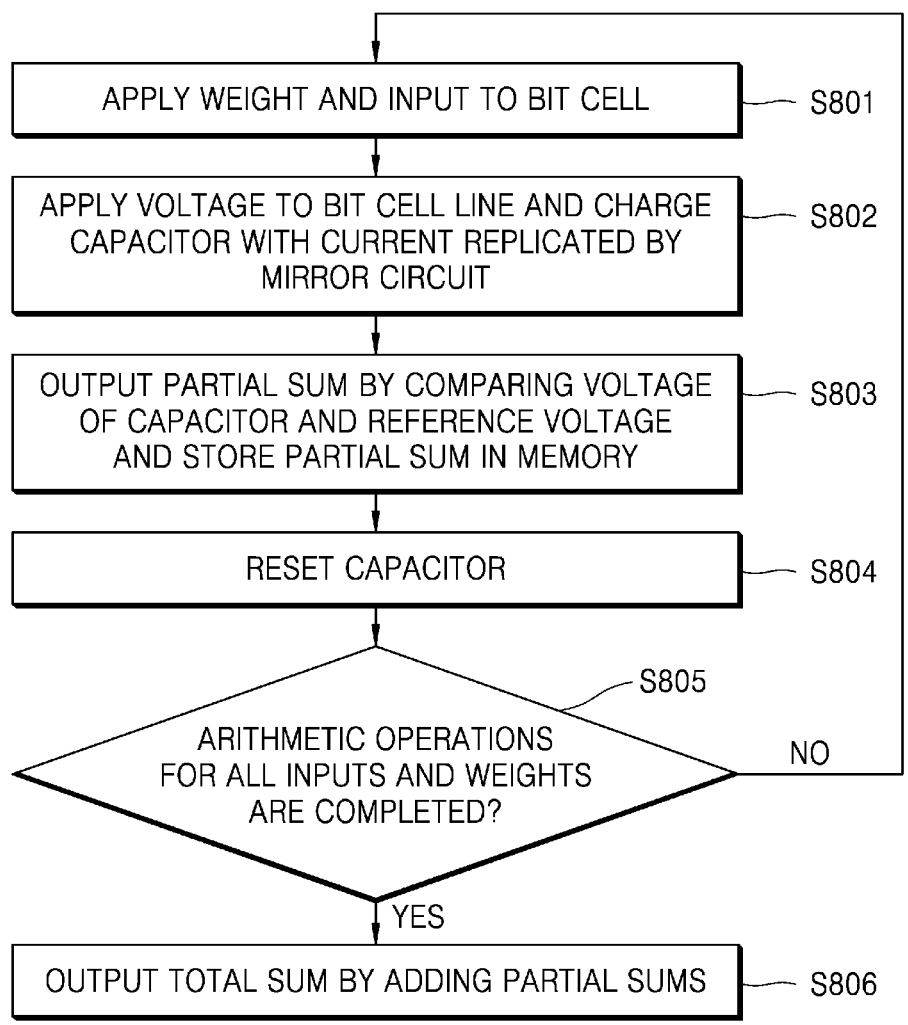
FIG. 7 is a diagram illustrating an example of a processing method.

FIG. 7 is a diagram illustrating an example of a method of driving the processing apparatus 100 of FIG. 4, and hereinafter, a method of performing an MAC operation as in Equation 5 by using the processing apparatus 100 of FIG. 4 will be described with reference to FIG. 7. The operations in FIG. 7 may be performed in the sequence and manner as shown, although the order of some operations may be changed or some of the operations may be omitted without departing from the spirit and scope of the illustrative examples described. Many of the operations shown in FIG. 7 may be performed in parallel or concurrently. In addition to the description of FIG. 7 below, the descriptions of FIGS. 1-6 are also applicable to FIG. 7, and are incorporated herein by reference. Thus, the above description may not be repeated here.

An input and a weight of Equation 5 will be described with an example of Table 2 below.

TABLE 2

| Input | Weight | Input × Weight |
|---|---|---|
| $x_1 = 1$ | $w_{11} = 1$ | 1 |
| $x_2 = 1$ | $w_{21} = -1$ | −1 |
| $x_3 = -1$ | $w_{31} = -1$ | 1 |
| $x_4 = -1$ | $w_{41} = 1$ | −1 |
| $x_5 = 1$ | $w_{51} = -1$ | −1 |
| $x_6 = 1$ | $w_{61} = 1$ | 1 |
| Sum of (Input × Weight) | | 0 |

Referring to Table 2, because the numbers of inputs and weights are six each, the processing apparatus 100 of FIG. 4 where there are only three bit cells, i.e., first through third bit cells $BC_{11}$ through $BC_{13}$, is unable to complete the arithmetic operation of Equation 5 in one time. In other words, the number of multiplications capable of being performed in one time by using the processing apparatus 100 of FIG. 4 is three, but because Equation 5 includes six multiplication operations, the arithmetic operation is unable to be completed in one time. Accordingly, the arithmetic operation of Equation 5 may be divided into two parts and the arithmetic operation may be performed by first calculating a first partial sum for products of the three inputs $x_1$, $x_2$, and $x_3$ and the weights $w_{11}$, $w_{21}$, and $w_{31}$, calculating a second partial sum for products of the remaining three inputs $x_4$, $x_5$, and $x_6$ and the weights $w_{41}$, $w_{51}$, and $w_{61}$, and then deriving a total sum by adding the first and second partial sums.

Referring to FIG. 7, the processing method may include applying a weight and an input to a bit cell (operation S801), applying a voltage to a bit cell line and charging a capacitor with a current replicated by a mirror circuit (operation S802), outputting a partial sum by comparing a voltage of the capacitor and a reference voltage and storing the partial sum in a memory (operation S803), resetting the capacitor (operation S804), determining whether arithmetic operations on all inputs and weights are completed (operation S805), and when operations on all partial sums are completed, outputting a total sum by adding the partial sums (operation S806).

In operation S801, the inputs $x_1$, $x_2$, and $x_3$ and the weights $w_{11}$, $w_{21}$, and $w_{31}$ needed for an arithmetic operation of the first partial sum are respectively applied to the first through third bit cells $BC_{11}$ through $BC_{13}$. A method of applying a weight and an input for each bit cell has been described above with reference to the bit cell BC of FIG. 2. States of the first through third bit cells $BC_{11}$ through $BC_{13}$ to which the inputs $x_1$, $x_2$, and $x_3$ and the weights $w_{11}$, $w_{21}$, and $w_{31}$ are applied are as shown in Table 3 below.

TABLE 3

| | Variable Resistance Value and Switch State | |
|---|---|---|
| First Bit Cell BC$_{11}$ | R$_a$ = 15 MΩ<br>S$_a$ = Close | R$_b$ = 10 MΩ<br>S$_b$ = Open |
| Second Bit Cell BC$_{12}$ | R$_a$ = 10 MΩ<br>S$_a$ = Close | R$_b$ = 15 MΩ<br>S$_b$ = Open |
| Third Bit Cell BC$_{13}$ | R$_a$ = 10 MΩ<br>S$_a$ = Open | R$_b$ = 15 MΩ<br>S$_b$ = Close |
| Combined Resistance | 40 MΩ | |

When the applying of the inputs $x_1$, $x_2$, and $x_3$ and the weights $w_{11}$, $w_{21}$, and $w_{31}$ to the first through third bit cells BC$_{11}$ through BC$_{13}$ is completed, a voltage of 1.008 V is applied to the positive input terminal $131_{i+}$ of the amplifier 131 and a voltage higher than 1.008 V, for example, the source voltage $V_S$, is applied to source terminals of the first and second transistors TR$_{M1}$ and TR$_{M2}$, in operation S802. The applying of a voltage may be performed by a controller (not shown). As described above, because the bit cell line voltage $V_{BC}$ is the same as 1.008 V applied to the positive input terminal $131_{i+}$ of the amplifier 131, a current flows in the bit cell line 110 by the Ohm's Law. Referring to Table 3, because the combined resistance of the bit cell line 110 is 40 MΩ, the bit cell line current I of 25.2 nA may flow.

The bit cell line current I may be replicated by the mirror circuit unit 130 and thus the mirror current I' of the same size may be transmitted to the charge charging unit 150. The controller may turn on the charging transistor TR$_C$ of the charge charging unit 150 such that the mirror current I' charges the capacitor C$_1$ for a certain time. In the embodiment of FIG. 7, the capacitor C$_1$ is charged for 1 ns. Because Q=I×t, when the charged charges are 25.2 aC and capacitance of the capacitor C$_1$ is 20 f[F], a voltage of 1.26 mV may be charged in the capacitor C$_1$. A charging state of the capacitor C$_1$ for calculating the first partial sum may be summarized as Table 4 below. In the embodiment of FIG. 7, the capacitance is 20 f[F], but the capacitance of the capacitor C$_1$ may be 10 to 100 f[F] or 20 to 80 [F].

TABLE 4

| Capacitance (f[F]) | Current (nA) | Charging Time (ns) | Charge Amount (aC) | Capacitor Voltage mV |
|---|---|---|---|---|
| 20 | 25.2 | 1 | 25.2 | 1.26 |

In operation S803, the partial sum may be output by comparing the voltage of the capacitor and the reference voltage and may be stored in the memory. The voltage charged in the capacitor C$_1$ may correspond to the combined resistance value of the bit cell line 110 and the combined resistance value of the bit cell line 110 corresponds to the first partial sum, and thus the partial sum may be determined from the voltage charged in the capacitor C$_1$. Relationships between the voltage of the capacitor C$_1$, the combined resistance of the bit cell line 110, and the partial sum may be summarized as Table 5 below.

TABLE 5

| Capacitor Voltage mV | Combined Resistance MΩ | Partial Sum |
|---|---|---|
| 1.12 | 45 | 3 |
| 1.26 | 40 | 1 |
| 1.44 | 35 | −1 |
| 1.68 | 30 | −3 |

Figure 8:
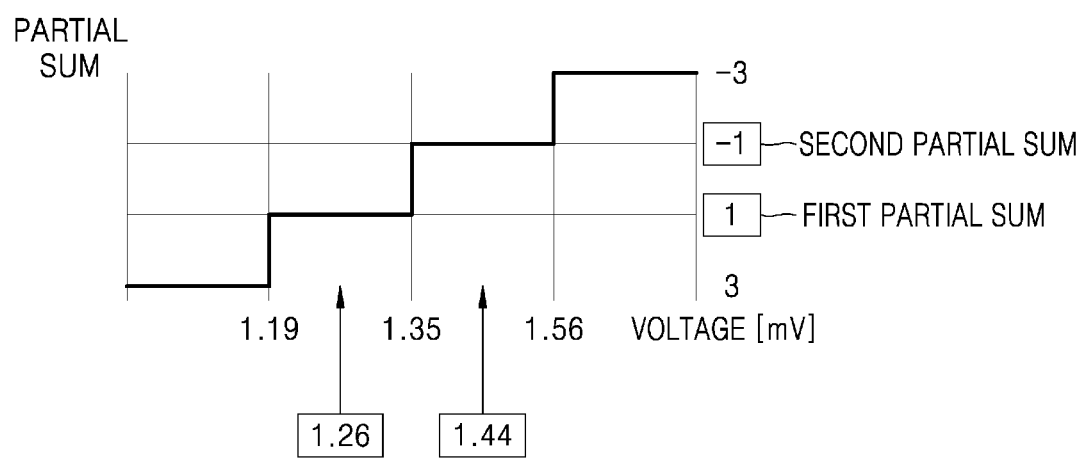
FIG. 8 is a diagram illustrating an example of outputting of a partial sum in the processing method of FIG. 7.

FIG. 8 is a diagram illustrating an example for describing outputting of the partial sum in the processing method of FIG. 7.

Referring to FIG. 8, a process by which the voltage measuring unit 170 outputs the partial sum from the voltage of the capacitor C$_1$ is shown.

The voltage measuring unit 170 may compare the voltage of the capacitor C$_1$ with reference voltages by using an internal comparator to determine a voltage of the capacitor C$_1$. The reference voltages may be determined to be values capable of distinguishing voltages measurable in the capacitor C$_1$, and may be intermediate values between the values indicatable by the voltages of the capacitor C$_1$. Referring to Table 5 above, a reference voltage for identifying whether the voltage indicatable by the capacitor C$_1$ is 1.12 mV may be 1.19 mV that is an intermediate value of 1.12 mV and 1.26 mV adjacent to 1.12 mV. When the voltage of the capacitor C$_1$ is smaller than the reference voltage 1.19 mV, the voltage measuring unit 170 may consider that the voltage of the capacitor C$_1$ is 1.12 mV and output a partial sum 3 corresponding thereto. Reference voltages, sections between the reference voltages, and a partial sum corresponding to each section in the embodiment of FIG. 7 may be summarized as Table 6 below.

TABLE 6

| Reference Voltage (mV) | Section to which Capacitor Voltage belongs (mV) | Partial Sum |
|---|---|---|
| — | Smaller than 1.19 | 3 |
| 1.19 | 1.19 to 1.35 | 1 |
| 1.35 | 1.35 to 1.56 | −1 |
| 1.56 | Greater than 1.56 | −3 |
| — | | |

Referring to Table 4, the voltage of the capacitor C$_1$ for the first partial sum of the embodiment of FIG. 7 is 1.26 mV. Referring to FIG. 8 and Table 6, because this voltage value belongs to a section greater than the reference voltage 1.19 mV and smaller than the reference voltage 1.35 mV, the voltage measuring unit 170 may output the first partial sum '1' as a result value and the first partial sum may be stored in a storage device such as the memory. In the embodiment of FIG. 7, the voltage measuring unit 170 outputs the first partial sum but the voltage measuring unit 170 may output another form of result corresponding to the first partial sum. For example, the voltage measuring unit 170 may output a digital value corresponding to the first partial sum, for example, a 2-bit number such as 00, 01, 10, or 11, and a partial sum may be derived from Table 7 below.

TABLE 7

| Output of Voltage Measuring Unit | Partial Sum |
|---|---|
| 11 | 3 |
| 10 | 1 |

TABLE 7-continued

| Output of Voltage Measuring Unit | Partial Sum |
|---|---|
| 01 | −1 |
| 00 | −3 |

When the arithmetic operation of first partial sum is completed, the capacitor $C_1$ is reset in operation S804. Here, the capacitor $C_1$ may turn on the reset transistor $TR_R$ of FIG. 4 to match the electric potential across the capacitor $C_1$, thereby resetting the capacitor $C_1$.

In operation S805, it is determined whether arithmetic operations for all inputs and weights are completed. Because an arithmetic operation of the second partial sum is not completed yet, operations S801 through S804 are repeated to calculate the second partial sum.

First, the inputs $x_4$, $x_5$, and $x_6$ and the weights $w_{41}$, $w_{51}$, and $w_{61}$ are respectively applied to the first through third bit cells $BC_{11}$ through $BC_{13}$. States of the first through third bit cells $BC_{11}$ through $BC_{13}$ to which the inputs $x_4$, $x_5$, and $x_6$ and the weights $w_{41}$, $w_{51}$, and $w_{61}$ are applied are as Table 8 below.

TABLE 8

| | Variable Resistance Value and Switch State | |
|---|---|---|
| First Bit Cell $BC_{11}$ | $R_a$ = 15 MΩ<br>$S_a$ = Open | $R_b$ = 10 MΩ<br>$S_b$ = Close |
| Second Bit Cell $BC_{12}$ | $R_a$ = 10 MΩ<br>$S_a$ = Close | $R_b$ = 15 MΩ<br>$S_b$ = Open |
| Third Bit Cell $BC_{13}$ | $R_a$ = 15 MΩ<br>$S_a$ = Close | $R_b$ = 10 MΩ<br>$S_b$ = Open |
| Combined Resistance | 35 MΩ | |

When the applying of the inputs $x_4$, $x_5$, and $x_6$ and the weights $w_{41}$, $w_{51}$, and $w_{61}$ to the first through third bit cells $BC_{11}$ through $BC_{13}$ is completed, a voltage of 1.008 V is applied to the positive input terminal $131_{i+}$ of the amplifier 131 and a voltage higher than 1.008 V, for example, the source voltage $V_S$, is applied to source terminals of the first and second transistors $TR_{M1}$ and $TR_{M2}$. Referring to Table 8, because the combined resistance of the bit cell line 110 is 35 MΩ, the bit cell line current I of 28.8 nA may flow by the Ohm's Law.

The bit cell line current I may be replicated by the mirror circuit unit 130 and thus the mirror current I' of the same size may be transmitted to the charge charging unit 150. A charging state of the capacitor $C_1$ for calculating the second partial sum may be summarized as Table 9 below.

TABLE 9

| Capacitance (f[F]) | Current (nA) | Charging Time (ns) | Charge Amount (aC) | Capacitor Voltage mV |
|---|---|---|---|---|
| 20 | 28.8 | 1 | 28.8 | 1.44 |

Referring to Table 9, the voltage of the capacitor $C_1$ is 1.44 mV. Referring to FIG. 8 and Table 6 again, because 1.44 mV belongs to a section greater than the reference voltage 1.35 mV and smaller than the reference voltage 1.56 mV, the voltage measuring unit 170 may output a result value '−1' and store the result value as the second partial sum in the storage device such as the memory.

When it is determined that the arithmetic operations of the first and second partial sums are completed (operation S805), a processing unit (not shown) may output a total sum that is a value obtained by adding all partial sums (the first and second partial sums) in operation S806. The total sum may be an arithmetic operation result of Equation 5 above, and adding of partial sums and outputting of a total sum may be performed by the processing unit, such as a central processing unit (CPU) of an electronic system including the processing apparatus 100. Because the first partial sum is '1' and the second partial sum is '−1', the total sum '0' may be output and stored in the storage device such as the memory.

An active function value obtained by applying an active function such as a sigmoid function as in Equation 1 above to the total sum may be provided as an input (activation) of a next node. For example, the active function value of Equation 5 above may be provided to the node bi included in the third layer 703, as an input. An arithmetic operation of an active function may be performed by a processor, such as a CPU.

In the embodiment of FIG. 7, an operating method of the processing apparatus 100 including only one bit cell line 110 is described, but the processing apparatus 100 may include a plurality of bit cell lines and may process, in parallel, arithmetic operations needed by a plurality of nodes. When a processing apparatus includes two bit cell lines, for example, a first bit cell line may perform an arithmetic operation of Equation 5 required by the first node $a_1$ of the second layer 702 of FIG. 6 while a second bit cell line may perform an arithmetic operation of Equation 6 needed by the second node $a_2$ of the second layer 702 of FIG. 6. The number of bit cell lines included in the processing apparatus 100 may be, for example, 40 to 100, but is not limited thereto.

Figure 9:
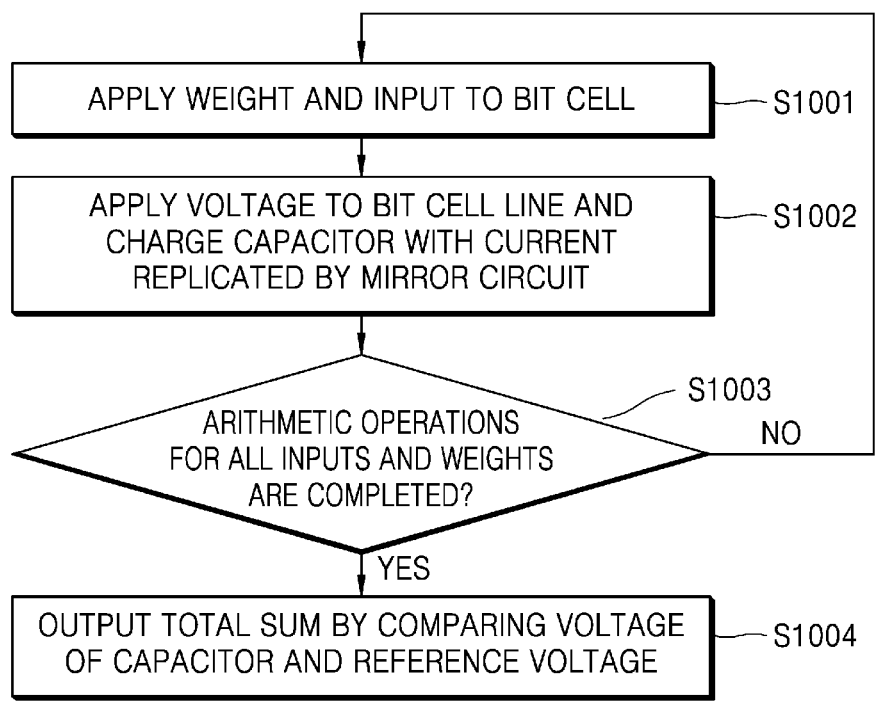
FIG. 9 is a diagram illustrating an example of a processing method.

FIG. 9 is a diagram illustrating an example of a method of driving the processing apparatus 100 of FIG. 4.

Hereinafter, a method of performing an arithmetic operation of Equation 5 by using the processing apparatus 100 of FIG. 4 will be described with reference to FIG. 9. The operations in FIG. 9 may be performed in the sequence and manner as shown, although the order of some operations may be changed or some of the operations may be omitted without departing from the spirit and scope of the illustrative examples described. Many of the operations shown in FIG. 9 may be performed in parallel or concurrently. In addition to the description of FIG. 9 below, the descriptions of FIGS. 1-8 are also applicable to FIG. 9, and are incorporated herein by reference. Thus, the above description may not be repeated here.

In the embodiment of FIG. 9, an input and a weight of Equation 5 will be described with an example of Table 2 above. The embodiment of FIG. 9 is different from the embodiment of FIG. 7 in that the capacitor $C_1$ is not reset between the arithmetic operation of the first partial sum and the arithmetic operation of the second partial sum of Equation 5. The embodiment of FIG. 9 is distinguished from the embodiment of FIG. 7 in that voltages for the three inputs $x_1$, $x_2$, and $x_3$ and weights $w_{11}$, $w_{21}$, and $w_{31}$ are charged in the capacitor $C_1$ and voltages for the remaining three inputs $x_4$, $x_5$, and $x_6$ and weights $w_{41}$, $w_{51}$, and $w_{61}$ are accumulated and charged in the capacitor $C_1$.

Referring to FIG. 9, the processing method may include applying a weight and an input to a bit cell (operation S1001), applying a voltage to a bit cell line and charging a capacitor with a current replicated by a mirror circuit (operation S1002), determining whether arithmetic operations for all inputs and weights are completed (operation S1003), and outputting a total sum by comparing a voltage of the capacitor and a reference voltage (operation S1004) after repeatedly performing operations SD1001 and S1002 until the arithmetic operations for all inputs and weights are completed.

First, in operation S1001, the inputs $x_1$, $x_2$, and $x_3$ and the weights $w_{11}$, $w_{21}$, and $w_{31}$ to be arithmetically operated in a first time section $t_1$ are respectively applied to the first through third bit cells $BC_{11}$ through $BC_{13}$. States of the first through third bit cells $BC_{11}$ through $BC_{13}$ to which the inputs $x_1$, $x_2$, and $x_3$ and the weights $w_{11}$, $w_{21}$, and $w_{31}$ to be arithmetically operated in the first time section $t_1$ are applied are as Table 3 above.

After applying inputs and weights to the first through third bit cells $BC_{11}$ through $BC_{13}$, a bit cell line voltage $V_{BC}$ of 1.008 V is applied by using the amplifier 131 in operation S1002. Because the combined resistance of the bit cell line 110 is 40 MΩ, the bit cell line current I of 25.2 nA may flow by the applied voltage.

The bit cell line current I is replicated by the mirror circuit unit 130 and the mirror current I' is transmitted to the charge charging unit 150, and the capacitor $C_1$ may be charged for 1 ns by an operation of the charging transistor $TR_C$. In the embodiment of FIG. 9, the capacitor $C_1$ of 20 f[F] may be charged to a voltage of 1.26 mV by a current of 25.2 nA. A charging state of the capacitor $C_1$ in the first time section $t_1$ may be as table 4 above.

Operations S1001 and S1002 may be repeated until it is determined that the arithmetic operations for all inputs and weights are completed (operation S1003). In particular, first, the inputs $x_4$, $x_5$, and $x_6$ and the weights $w_{41}$, $w_{51}$, and $w_{61}$ to be arithmetically operated in a second time section $t_2$ are applied respectively to the first through third bit cells $BC_{11}$ through $BC_{13}$. The charging transistor $TR_C$ is turned off while the inputs $x_4$, $x_5$, and $x_6$ and the weights $w_{41}$, $w_{51}$, and $w_{61}$ are applied to the first through third bit cells $BC_{11}$ through $BC_{13}$. Accordingly, the charges stored in the capacitor $C_1$ are preserved and the voltage of the capacitor $C_1$ may be maintained to a voltage charged in the first time section $t_1$. When variable resistors included in the first through third bit cells $BC_{11}$ through $BC_{13}$ are MTJ devices, a time needed to apply an input and a weight to one variable resistor is generally about 20 ns to 40 ns, and a discharge amount of the charges charged in the capacitor $C_1$ being discharged while the input and weight is arithmetically operated in the second time section $t_2$ may be ignored. States of the first through third bit cells $BC_{11}$ through $BC_{13}$ to which the inputs $x_4$, $x_5$, and $x_6$ and the weights $w_{41}$, $w_{51}$, and $w_{61}$ to be arithmetically operated in the second time section $t_2$ are applied are as shown Table 8 above.

After applying inputs and weights to the first through third bit cells $BC_{11}$ through $BC_{13}$, the bit cell line voltage $V_{BC}$ of 1.008 V is applied by using the amplifier 131. Because the combined resistance of the bit cell line 110 is 35 MΩ, the bit cell line current I of 28.8 nA may flow in the second time section $t_2$.

Figure 10:
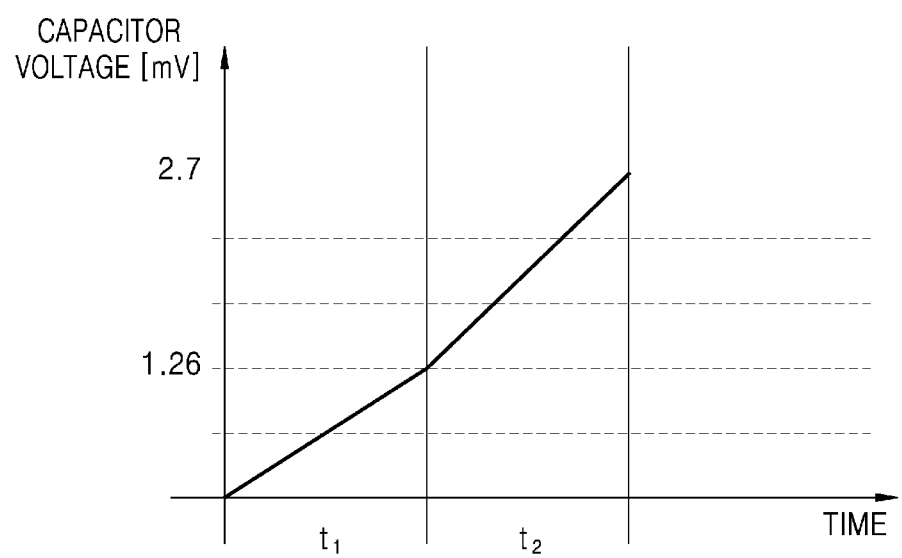
FIG. 10 is a diagram illustrating an example of a voltage change of a capacitor of FIG. 9.

The bit cell line current I is replicated by the mirror circuit unit 130 and the mirror current I' is transmitted to the charge charging unit 150, and the capacitor $C_1$ may be charged for 1 ns as the charging transistor $TR_C$ is turned on. A charge amount charged in the capacitor $C_1$ by the current of 28.8 nA for 1 ns is 28.8 aC, and because the charges of 25.2 aC charged in the first time section $t_1$ are preserved in the capacitor $C_1$, the charges of 54 aC may be charged when the charge amount charged in the second time section $t_2$ is accumulated. Because Q=CV, the voltage of the capacitor $C_1$ after the second time section $t_2$ may be 2.7 mV. FIG. 10 is a diagram illustrating an example of a graph of a change in the voltage of the capacitor $C_1$ in the first and second time sections $t_1$ and $t_2$, and charges and voltages charged during the first and second time sections $t_1$ and $t_2$ may be summarized as Table 10 below.

TABLE 10

| Time Section | Current (nA) | Charging Time (ns) | Charging charge (aC) | Capacitor Voltage mV |
|---|---|---|---|---|
| $t_1$ | 25.2 | 1 | 25.2 | 1.26 |
| $t_2$ | 28.8 | 1 | 28.8 | 1.44 |
| $t_1 + t_2$ | — | — | 54 | 2.7 |

When it is determined that the arithmetic operations for all inputs and weights are completed (operation S1003), the total sum is output by comparing the voltage of the capacitor $C_1$ and the reference voltage in operation S1004. Because the voltage charged in the capacitor $C_1$ may correspond to a value obtained by adding a combined resistance value of a bit cell line in the first time section $t_1$ and a combined resistance value of a bit cell line in the second time section $t_2$, the total sum may be determined from the voltage charged in the capacitor $C_1$.

The embodiment of FIG. 9 is different from the embodiment of FIG. 7 in that the total sum is output from a final voltage of the capacitor $C_1$ without outputting partial sums that are sums of products of inputs and weights applied in the first and second sections $t_1$ and $t_2$. Relationships between the voltage of the capacitor $C_1$, a value obtained by adding the combined resistance in the first time section $t_1$ and the combined resistance in the second time section $t_2$, and the total sum may be summarized as Table 11 below.

TABLE 11

| Capacitor Voltage mV | Added Value of Combined Resistances (MΩ) | Total Sum |
|---|---|---|
| 2.24 | 90 | 6 |
| 2.38 | 85 | 4 |
| 2.52 | 80 | 2 |
| 2.7 | 75 | 0 |
| 2.88 | 70 | -2 |
| 3.12 | 65 | -4 |
| 3.36 | 60 | -6 |

Figure 11:
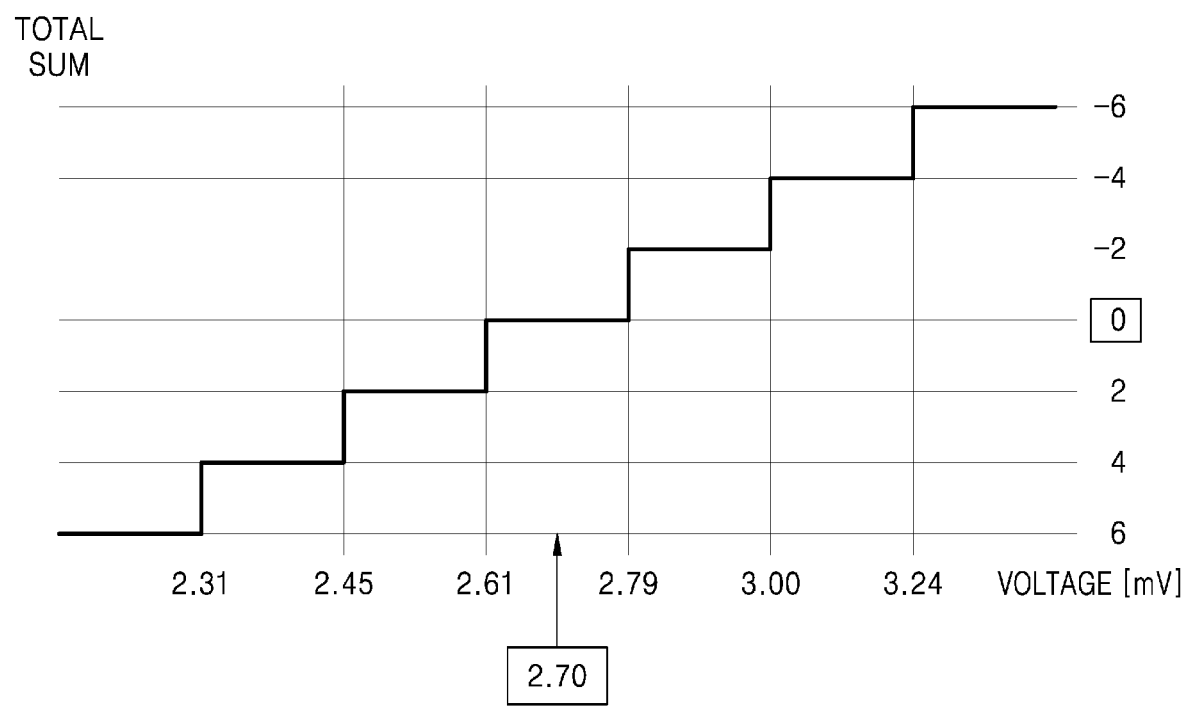
FIG. 11 is a diagram illustrating an example for describing outputting of a total sum in the processing method of FIG. 9.

FIG. 11 is a diagram illustrating an example for describing a process by which the voltage measuring unit 170 outputs the total sum from the voltage of the capacitor $C_1$ in the processing method of FIG. 9.

The voltage measuring unit 170 may compare the voltage of the capacitor $C_1$ with reference voltages by using an internal comparator (not shown) to determine the voltage of the capacitor $C_1$. Sections that may be distinguished by the reference voltages and a total sum corresponding to each section may be summarized as Table 12 below.

TABLE 12

| Reference Voltage (mV) | Section to which Capacitor Voltage belongs (mV) | Total Sum |
|---|---|---|
| — | Equal to or less than 2.31 | 6 |
| 2.31 | 2.31 to 2.45 | 4 |
| 2.45 | 2.45 to 2.61 | 2 |

TABLE 12-continued

| Reference Voltage (mV) | Section to which Capacitor Voltage belongs (mV) | Total Sum |
| --- | --- | --- |
| 2.61 | 2.61 to 2.79 | 0 |
| 2.79 | 2.79 to 3.00 | −2 |
| 3.00 | 3.00 to 3.24 | −4 |
| 3.24 | Equal to or greater than 3.24 | −6 |
| — | | |

In the embodiment of FIG. 9, the voltage of 2.7 mV of the capacitor $C_1$ where the charging is completed up to the second time section $t_2$ corresponds to a section greater than a reference voltage 2.61 mV and less than a reference voltage 2.79 mV, and thus the voltage measuring unit 170 may output a result value '0' referring to FIG. 11 and Table 12. The result value '0' derived by the voltage measuring unit 170 may be an arithmetic operation result of Equation 5 and an active function may be applied to the result value to be provided as an input to the node bi of the third layer 703 of FIG. 6. A value of the active function may be a binary value of −1 or 1 as provided from the first layer 701 to the second layer 702 of FIG. 6.

In the embodiment of FIG. 9, charges are accumulated and charged in the capacitor $C_1$ over two times in the first and second time sections $t_1$ and $t_2$, but may alternatively accumulated and charged over three times or more. For example, to calculate an equation including 12 multiplications by using the processing apparatus 100 of FIG. 4 in which there are three bit cells, a value accumulated and charged four times may be used. When the capacity of the capacitor $C_1$ is not sufficient enough to accumulate and charge charges needed in an arithmetic operation, the mirror circuit unit 130 may be designed such that the mirror current I' is smaller than the bit cell line current I. For example, when a charge amount accumulative in an arithmetic operation is 20 μC but the maximum storage capacity of the capacitor $C_1$ is 10 μC, the mirror circuit unit 130 may be designed such that the mirror current I' is ½ of the bit cell line current I. As described above with reference to FIG. 5, the mirror current I' may be reduced by adjusting the channel aspect ratio (W/L) of the transistors included in the mirror circuit unit 130, and when the mirror current I' is reduced by ½, the storage capacity of the capacitor $C_1$ may be doubled.

Figure 12:
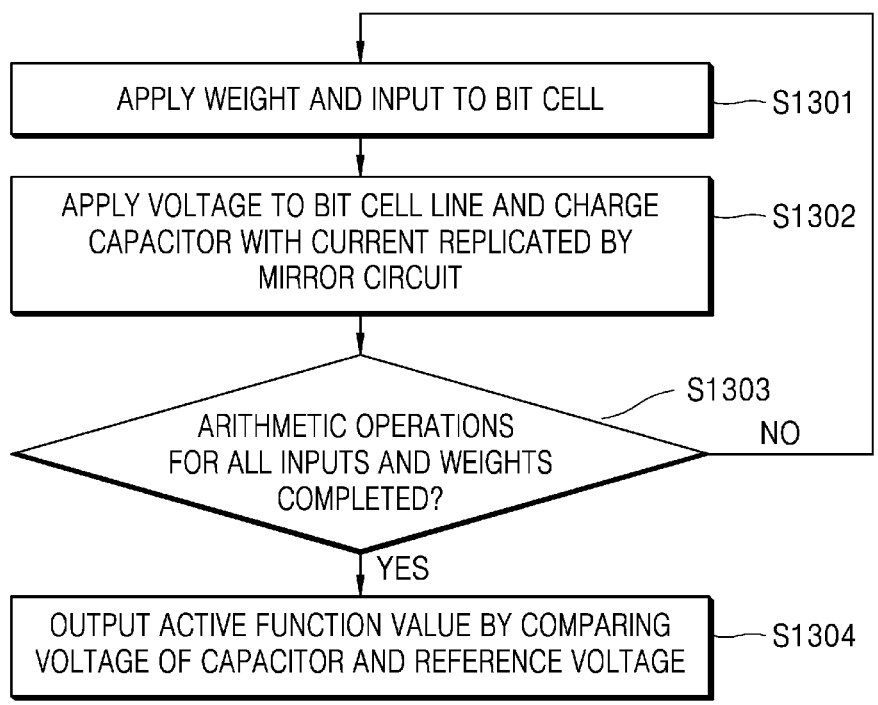
FIG. 12 is a diagram illustrating an example of a processing method.
Figure 13:
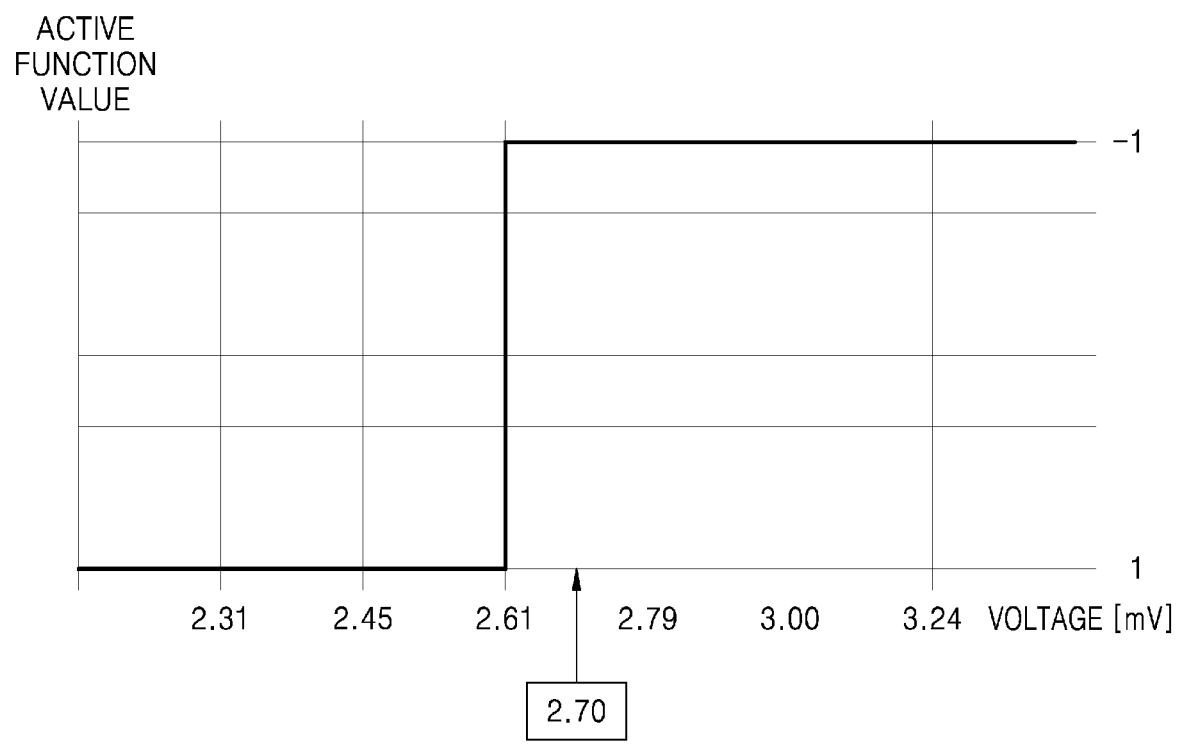
FIG. 13 is a diagram illustrating an example for describing outputting of an active function value in the processing method of FIG. 12.

FIGS. 12 and 13 are diagrams illustrating example for describing operations of a processing method by which the voltage measuring unit 170 of FIG. 4 outputs an active function value.

As described above with reference to Equation 1, because a value obtained by applying an active function, such as a sigmoid function, to an MAC operation result as Equation 5 is used in a next node, an operation efficiency may be increased when the voltage measuring unit 170 of FIG. 4 outputs an active function value instead of a total sum. In other words, when the voltage measuring unit 170 outputs an active function value of a total sum instead of the total sum, processes of outputting the total sum, storing the total sum in a memory, and calculating an active function of the total sum by using a processor, such as a CPU, may be skipped. Operations S1301 through S1303 of the processing method FIG. 12 may be performed in the similar manner as operations S1001 through S1003 of the processing method FIG. 9. However, in the processing method of FIG. 9, outputting of the total sum (operation S1004) may be changed to (or replaced by) outputting of the active function value (operation S1304) of FIG. 12.

Referring to an example in which the voltage measuring unit 170 outputs the active function value of 1 or −1 instead of outputting the total sum as in the embodiment of FIG. 9, when the total sum is 2 or greater, the active function value '1' may be output and when the total sum is 0 or less, the active function value '−1' may be output. Table 13 below is a summary of the voltage of the capacitor $C_1$, the total sum, and the active function value with reference to Table 11.

TABLE 13

| Capacitor Voltage mV | Total Sum | Active Function Value |
| --- | --- | --- |
| 2.24 | 6 | 1 |
| 2.38 | 4 | 1 |
| 2.52 | 2 | 1 |
| 2.70 | 0 | −1 |
| 2.88 | −2 | −1 |
| 3.12 | −4 | −1 |
| 3.36 | −6 | −1 |

Referring to Table 13, when the total sum is 2 or greater, the voltage of the capacitor $C_1$ is smaller than 2.52 mV, and when the total sum is 0 or less, the voltage of the capacitor $C_1$ is greater than 2.70 mV, 2.61 mV that is an intermediate value of 2.52 mV and 2.70 mV is determined as a reference voltage. Then, the voltage measuring unit 170 may output the active function value of Table 13 above by outputting −1 when the voltage of the capacitor $C_1$ exceeds the reference voltage, and outputting 1 when the voltage is equal to or less than the reference voltage. The reference voltage and the output of the voltage measuring unit 170 may be summarized as Table 14 below.

TABLE 14

| Reference Voltage (mV) | Section to which Capacitor Voltage belongs (mV) | Output Value |
| --- | --- | --- |
| — | Equal to or less than 2.61 | 1 |
| 2.61 | Exceeds 2.61 | −1 |
| — | | |

Referring to FIG. 13 and Table 14, because the voltage of 2.70 mV is charged in the capacitor $C_1$ in which the charging is completed up to the second time section $t_2$ of the embodiment of FIG. 9, the voltage measuring unit 170 may output the active function value '−1'. The active function value may be stored in the memory to be used later or may be immediately provided as an input to the node bi of the third layer 703 of FIG. 6.

Figure 14:
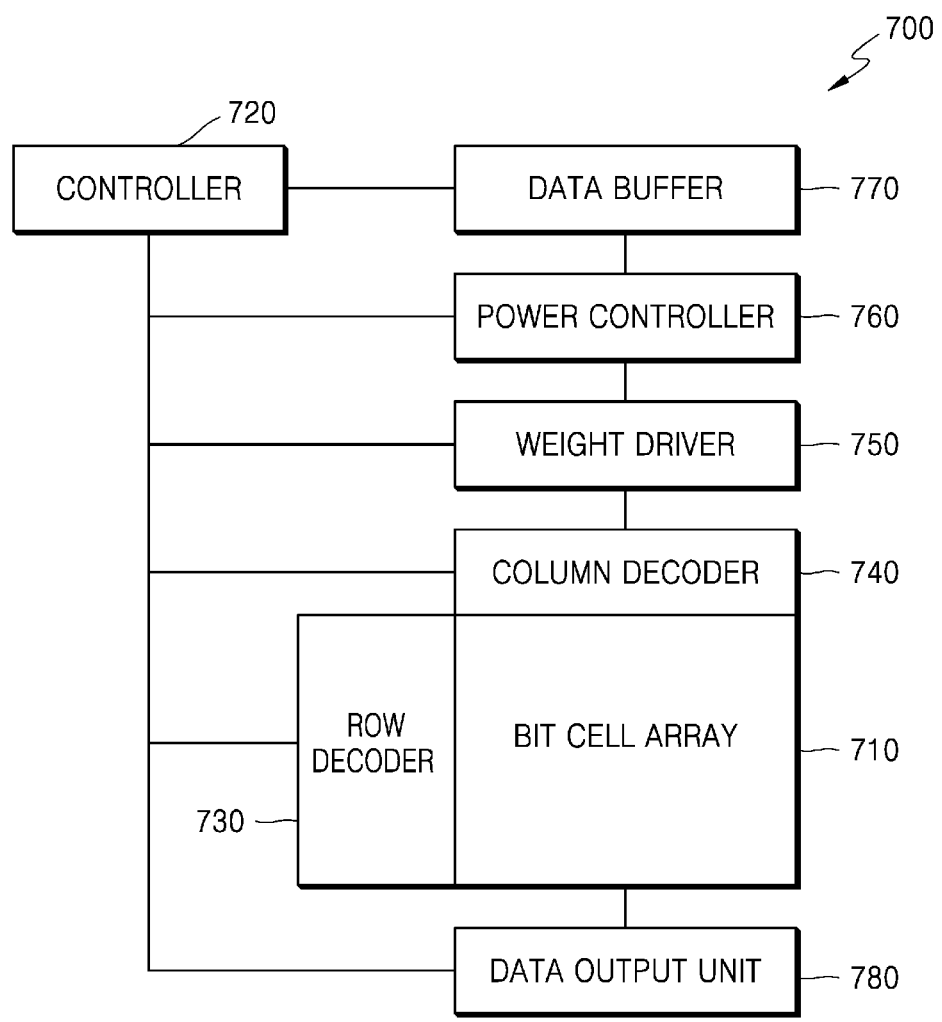
FIG. 14 illustrates an example of chip block diagram of a processing apparatus.

FIG. 14 illustrates an example of a chip block diagram of a processing apparatus 700.

Referring to FIG. 14, the processing apparatus 700 includes a bit cell array 710, a controller 720, a row decoder 730, a column decoder 740, a weight driver 750, a power controller 760, a data buffer 770, and a data output unit 780.

The controller 720 may decode a command required for driving and operations of the processing apparatus 700. For example, the controller 720 may decode commands, such as weight setting, weight setting examination, input application, voltage measurement, partial sum/total sum output, and active function value output, and transmit signals to components required to perform the commands.

The bit cell array 710 may be an array of bit cells including variable resistors and switches described above. Here, the variable resistor may be a MTJ device including a magnetic material.

The row decoder 730 may apply an input value to the bit cell array 710 by receiving a row address and an input signal. The row decoder 730 may include a digital-to-analog converter (DAC) (or an analog-to-digital converter (ADC)) and apply a driving voltage to the switch connected to the variable resistor in series, based on the input value. Also, the row decoder 730 may change a resistance value of the variable resistor included in the bit cell in the bit cell array 710 and at this time, may apply the driving voltage to the switches associated to select a target variable resistor.

The column decoder 740 may apply a voltage/current to the variable resistor by receiving a column address and a weight setting signal. The column decoder 740 may select a bit cell line that require voltage measurement and a weight line connected to a bit cell that require weight setting.

The weight driver 750 may transmit weight data to a bit cell selected by the row decoder 730 and the column decoder 740. The weight driver 750 may drive a weight line connected to the column decoder 740 based on data received from the data buffer 770 to set a weight and examine the set weight. The weight driver 750 may include a current source that applies an examination current to the weight line to examine whether a desired resistance value is set in the variable resistor.

The power controller 760 drives a power source by receiving a signal from the controller 720 and may apply a voltage to a positive input terminal of an amplifier and a source voltage to transistors of a mirror circuit unit.

The data output unit 780 may include the voltage measuring unit 170 of FIG. 4, and may measure a voltage of a bit cell line or a capacitor connected to one end of the bit cell line and store a measured value in an external memory (not shown). The data output unit 780 may include an ADC that outputs the measured value in a digital value.

Figure 15:
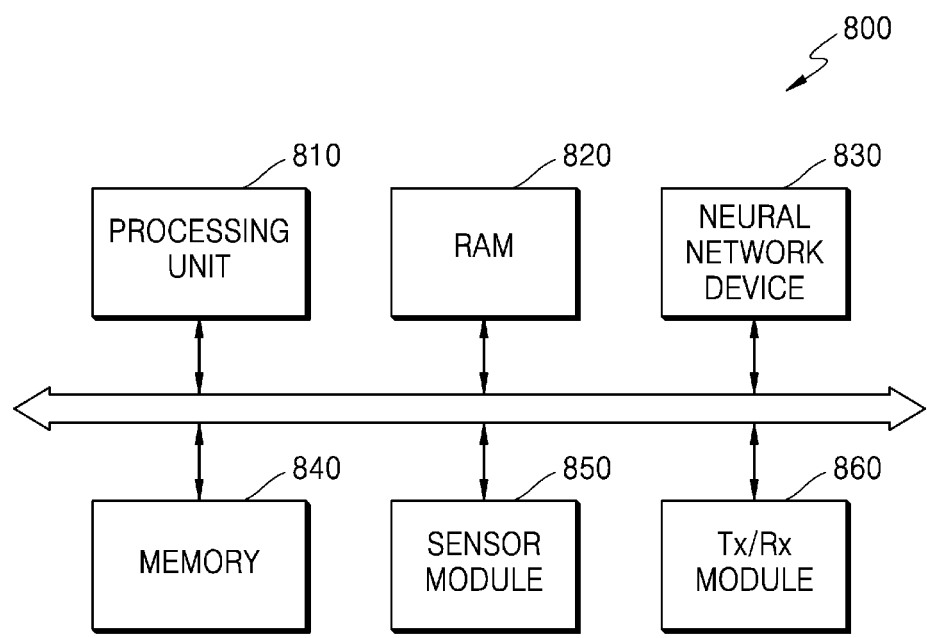
FIG. 15 is a diagram illustrating an example of an electronic device.

FIG. 15 is a diagram illustrating an example of an electronic device 800.

Referring to FIG. 15, the electronic device 800 may extract valid information by analyzing input data based on a neural network device 830 including a processing apparatus, and determine a situation or control components of an electronic apparatus where the electronic device 800 is mounted, based on the extracted information. For example, the electronic device 800 may be applied to a robot device such as a drone or advanced drivers assistance system (ADAS), a smart TV, a smart phone, a medical device, a mobile device, an image display device, a security verification/authentication device, a measurement device, or an Internet of things (IoT) device, a smart home device, and may be mounted on other various types of electronic apparatuses.

The electronic device 800 may include, in addition to the neural network device 830, a processing unit 810, a random-access memory (RAM) 820, a memory 840, a sensor module 850, and a communication (Tx/Rx) module 860. In addition, the electronic device 800 may further include an input/output module, a security module, and a power control apparatus. Some of hardware components of the electronic device 800 may be mounted on a semiconductor chip. The neural network device 830 may be a processing apparatus according to the embodiments described above implemented in an on-chip type or may be a device including the processing apparatus as a part of the device.

The processing unit 810 may control overall operations of the electronic device 800. The processing unit 810 may be a CPU and may include one processor core (single core) or a plurality of processor cores (multi-core). The processing unit 810 may process or execute programs and/or data stored in the memory 840 and may control functions of the neural network device 830 by executing the programs stored in the memory 840. The processing unit 810 may be implemented as one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, an FPGA, a programmable logic unit (PLU), a central processing unit (CPU), a graphics processing unit (GPU), a neural processing unit (NPU), or any other device capable of responding to and executing instructions in a defined manner, in addition to the CPU.

The RAM 820 may temporarily store programs, data, or instructions. For example, the programs and/or data stored in the memory 840 may be temporarily stored in the RAM 820 according to control or booting code of the processing unit 810. The RAM 820 may be implemented as a memory device, such as dynamic RAM (DRAM) or static RAM (SRAM).

The neural network device 830 may perform an operation of a neural network based on received input data and generate an information signal based on a result of the performing. The neural network device 830 may include a processing apparatus of the embodiments described above. The neural network may include a convolution neural network (CNN), a recurrent neural network (RNN), a deep belief network, or restricted Boltzmann machines, but is not limited thereto. The neural network device 830 may correspond to a neural network-dedicated hardware accelerator.

The information signal may include various types of recognition signals, such as a voice recognition signal, an object recognition signal, an image recognition signal, and a biometric information recognition signal. For example, the neural network device 830 may receive, as input data, frame data included in a video stream and generate a recognition signal on an object included in an image represented by the frame data. The neural network device 830 may receive various types of input data depending on a type or function of an electronic apparatus on which the electronic device 800 is mounted and may generate a recognition signal according to the input data.

The memory 840 is a storage space for storing data and may store an operating system (OS), various programs, and various types of data. The memory 840 may include a volatile memory or a non-volatile memory. The non-volatile memory includes a read-only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), or a ferroelectric RAM (FRAM). The voltage memory includes a dynamic RAM (DRAM), a static RAM (SRAM), a synchronous DRAM (SDRAM), a phase-change RAM (PRAM), a magnetic RAM (MRAM), a resistive RAM (RRAM), or a ferroelectric RAM (FeRAM). The memory 840 may include, for example, a hard disk drive (HDD), a solid-state drive (SSD), a compact flash (CF) card, a secure digital (SD) card, a micro-SD card, a mini-SD card, an extreme digital (xD) card, or a memory stick.

The sensor module 850 may collect information around the electronic apparatus on which the electronic device 800 is mounted. The sensor module 850 may sense or receive a signal (for example, an image signal, a voice signal, a magnetic signal, a biometric signal, or a touch signal) from outside the electronic apparatus, and convert the sensed or received signal into data. In this regard, the sensor module 850 may be any type of sensing device, such as a microphone, an imaging device, an image sensor, a light detection and ranging (LIDAR) sensor, an ultrasound sensor, an infrared sensor, a bio-sensor, or a touch sensor.

The sensor module 850 may provide the converted data to the neural network device 830 as input data. For example, the sensor module 850 may include an image sensor to generate a video stream by capturing images of an external environment of the electronic apparatus and provide, as input data to the neural network device 830, consecutive data frames of the video stream in an order. However, an embodiment is not limited thereto and the sensor module 850 may provide various types of data to the neural network device 830.

The Tx/Rx module 860 may include various wired or wireless interface capable of communicating with an external apparatus. For example, the Tx/Rx module 860 may include a communication interface capable of accessing a local area network (LAN), a wireless LAN (WLAN) such as wireless fidelity (Wi-Fi), a wireless personal area network (WPAN) such as the Bluetooth, a wireless universal serial bus (USB), Zigbee, near field communication (NFC), radio-frequency identification (RFID), power line communication (PLC), or a mobile cellular network such as 3rd generation (3g), 4G, long-term evolution (LTE), or 5G.

The electronic device 800 may further include not only a processor, a memory device storing and executing program data, a permanent storage such as a disk drive, or a communication port communicating with an external device, but also a user interface device such as a touch panel, a key, or a button. Methods implemented by a software module or algorithm may be stored in a computer-readable recording medium as computer-readable codes or program instructions executable on a processor.

The embodiments described above are processing apparatuses with improved reliability of an analog arithmetic operation and power efficiency, and electronic systems including the same.

The embodiments described above are only examples and do not limit the technical scope in any way. For brevity of the specification, well-known electronic configurations, control systems, software, and other functional aspects are omitted. In addition, connection or connection members of lines between components shown in the drawings exemplarily represent functional connections and/or physical or circuit connections, and in an actual apparatus, may be replaced or may be implemented as various additional functional connections, physical connections, or circuit connections.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A processing apparatus comprising:
   a bit cell line comprising bit cells connected in series;
   a mirror circuit unit configured to generate a mirror current by replicating a current, flowing through the bit cells, at a ratio;
   a charge charging unit configured to charge a voltage corresponding to the mirror current as the mirror current replicated by the mirror circuit unit is applied; and
   a voltage measuring unit configured to output a value corresponding to a multiply-accumulate (MAC) operation of weights and inputs applied to the bit cells, based on the voltage charged by the charge charging unit,
   wherein the value corresponding to the MAC operation comprises an active function value corresponding to a result of the MAC operation of the weights and the inputs applied to the bit cell line.

2. The processing apparatus of claim 1, wherein the mirror circuit unit comprises a first transistor connected to the bit cell line and a second transistor connected to the charge charging unit to provide the mirror current to the charge charging unit, and
   a gate of the first transistor and a gate of the second transistor are connected to each other.

3. The processing apparatus of claim 2, wherein a channel aspect ratio of the second transistor is less than or equal to a channel aspect ratio of the first transistor.

4. The processing apparatus of claim 2,
   wherein the mirror circuit unit further comprises an amplifier connected to the bit cell line to uniformly maintain a voltage at one end of the bit cell line, and
   an output terminal of the amplifier is connected to the gate of the first transistor and the gate of the second transistor.

5. The processing apparatus of claim 1, wherein the mirror circuit unit comprises an amplifier connected to the bit cell line to uniformly maintain a voltage at one end of the bit cell line.

6. The processing apparatus of claim 5, wherein a negative (−) input terminal of the amplifier is connected to the bit cell line.

7. The processing apparatus of claim 1, wherein the ratio is equal to or less than 1.

8. The processing apparatus of claim 1, wherein the ratio is equal to or less than ½.

9. The processing apparatus of claim 1, wherein the charge charging unit comprises:
   a capacitor configured to charge based on a time for which the mirror current is applied; and
   a charging transistor configured to control a time for which the capacitor is charged by the mirror current.

10. The processing apparatus of claim 9, wherein the voltage measuring unit comprises a comparator configured to compare a reference voltage and a voltage across the capacitor.

11. The processing apparatus of claim 1, wherein each of the bit cells comprises two variable resistors connected in parallel and two switches respectively connected to the two variable resistors in series.

12. The processing apparatus of claim 11, wherein in response to one of the two switches being open, the other switch is closed.

13. The processing apparatus of claim 11, wherein each of the two variable resistors comprise a tunnel layer disposed between a pinned layer and a free layer,
wherein a magnetization direction of the pinned layer is fixed, and a magnetization direction of the free layer is same as or different from a magnetization direction of the pinned layer.

14. The processing apparatus of claim 11, wherein the bit cell line further comprises:
a bit-data line transmitting a signal for changing a resistance value of each of the two variable resistors; and
a bit-data line switch for connecting the bit-data line to each of the two variable resistors.

15. A processing method comprising:
applying a first input and a first weight to a bit cell line comprising bit cells connected in series;
transmitting, to a charge charging unit, a first mirror current obtained by replicating a current flowing through the bit cells by a first voltage applied to the bit cell line according to a first ratio;
charging a capacitor for a first time with the first mirror current;
applying a second input and a second weight to the bit cell line;
transmitting, to the charge charging unit, a second mirror current obtained by replicating a current flowing through the bit cells by a second voltage applied to the bit cell line according to a second ratio;
charging the capacitor for a second time with the second mirror current; and
outputting a value corresponding to a multiply-accumulate (MAC) operation of weights and inputs applied to the bit cells, based on a capacitor voltage charged in the capacitor,
wherein the value corresponding to the MAC operation comprises an active function value corresponding to a result of the MAC operation of the weights and the inputs applied to the bit cell line.

16. The processing method of claim 15, wherein the first ratio and the second ratio is equal to or less than 1.

17. The processing method of claim 15, wherein the first ratio and the second ratio is equal to or less than ½.

18. The processing method of claim 15, wherein the charging of the capacitor for the second time with the second mirror current comprises accumulating and charging charge in the capacitor charged with the first mirror current.

19. The processing method of claim 15, wherein the outputting comprises outputting the value by comparing a reference voltage and the charged capacitor voltage.

20. A non-transitory computer-readable storage medium storing instructions that, when executed by a processor, cause the processor to perform the method of claim 15.

21. An electronic device comprising:
a neural network apparatus; and
a processing unit configured to controlling a function of the neural network apparatus,
wherein the neural network apparatus comprises:
a bit cell line comprising bit cells connected in series;
a mirror circuit unit configured to generate a mirror current by replicating a current flowing through the bit cell line at a ratio;
a charge charging unit configured to charge a voltage corresponding to the mirror current as the mirror current replicated by the mirror circuit unit is applied; and
a voltage measuring unit configured to output a value corresponding to a multiply-accumulate (MAC) operation of weights and inputs applied to the bit cell line, based on the voltage charged by the charge charging unit,
wherein the value corresponding to the MAC operation comprises an active function value corresponding to a result of the MAC operation of the weights and the inputs applied to the bit cell line.

22. The electronic device of claim 21, wherein the mirror circuit unit comprises a first transistor connected to the bit cell line and a second transistor connected to the charge charging unit to provide the mirror current to the charge charging unit, and
a gate of the first transistor and a gate of the second transistor are connected to each other.

23. The electronic device of claim 22, wherein a channel aspect ratio of the second transistor is less than or equal to a channel aspect ratio of the first transistor.

24. The electronic device of claim 22, wherein the mirror circuit unit further comprises an amplifier connected to the bit cell line to uniformly maintain a voltage at one end of the bit cell line, and
an output terminal of the amplifier is connected to the gate of the first transistor and the gate of the second transistor.

25. The electronic device of claim 21, wherein the mirror circuit unit comprises an amplifier connected to the bit cell line to uniformly maintain a voltage at one end of the bit cell line.

26. The electronic device of claim 25, wherein a negative (−) input terminal of the amplifier is connected to the bit cell line.

27. The electronic device of claim 21, wherein the ratio is equal to or less than 1.

28. The electronic device of claim 22, wherein the charge charging unit comprises:
a capacitor configured to charge based on a time for which the mirror current is applied; and
a charging transistor configured to control a time for which the capacitor is charged by the mirror current.

29. The electronic device of claim 28, wherein the voltage measuring unit comprises a comparator configured to compare a reference voltage and a voltage across the capacitor.

30. The electronic device of claim 21, wherein the value corresponding to the MAC operation comprises an active function value corresponding to a result of the MAC operation of the weights and the inputs applied to the bit cell line.

31. The electronic device of claim 21, wherein each of the bit cells comprises two variable resistors connected in parallel and two switches respectively connected to the two variable resistors in series.

32. The electronic device of claim 31, wherein the bit cell line further comprises:
a bit-data line transmitting a signal for changing a resistance value of each of the two variable resistors; and
a bit-data line switch for connecting the bit-data line to each of the two variable resistors.

33. The processing apparatus of claim 1, wherein the output value of the voltage measuring unit is based on respective voltages charged by the charge charging unit, based on corresponding currents respectively flowing through the bit cells, representing partial sums of the MAC operation of the weights and the inputs.

34. The processing apparatus of claim 5, wherein the current flowing through the bit cell line flows through plural bit cells in series.

35. The processing apparatus of claim 9, wherein the current flowing through the bit cell line flows through plural bit cells in series.

36. The processing apparatus of claim 1, wherein the current flowing through the bit cell line flows through plural bit cells in series.

37. The processing apparatus of claim 11, wherein the current flowing through the bit cell line flows through plural bit cells in series.

38. The electronic device of claim 21,
- wherein bit cell line includes a second bit cell of the bit cells configured to have a second resistance resulting from a second input and second weight applied to the second bit cell, and
- wherein the current flowing through the bit cell line is dependent on the voltage applied to the bit cell line and the first resistance and the second resistance.

39. The electronic device of claim 21, wherein a first bit cell of the bit cells is configured to have a first resistance resulting from a first input and first weight applied to the first bit cell, and
- wherein the current flowing through the bit cell line is dependent on voltage applied to the bit cell line and the first resistance.

* * * * *